United States Patent
Lee et al.

(10) Patent No.: US 12,230,498 B2
(45) Date of Patent: Feb. 18, 2025

(54) METHOD FOR MANUFACTURING SEMICONDUCTOR DEVICE INCLUDING AIR GAP

(71) Applicant: Samsung Electronics Co., Ltd., Suwon-si (KR)

(72) Inventors: Dain Lee, Hwaseong-si (KR); Yoongoo Kang, Hwaseong-si (KR); Wonseok Yoo, Seoul (KR); Jinwon Ma, Hwaseong-si (KR); Kyungwook Park, Pohang-si (KR); Changwoo Seo, Suwon-si (KR); Suyoun Song, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 177 days.

(21) Appl. No.: 17/222,195

(22) Filed: Apr. 5, 2021

(65) Prior Publication Data

US 2022/0093387 A1     Mar. 24, 2022

(30) Foreign Application Priority Data

Sep. 23, 2020    (KR) ........................ 10-2020-0122830

(51) Int. Cl.
*H01L 21/02*       (2006.01)
*C23C 16/34*       (2006.01)
(Continued)

(52) U.S. Cl.
CPC .... *H01L 21/0228* (2013.01); *C23C 16/45525* (2013.01); *H01L 21/02362* (2013.01); *C23C 16/345* (2013.01); *C23C 16/36* (2013.01)

(58) Field of Classification Search
CPC ........... H01L 21/0228; H01L 21/02362; C23C 16/45525; C23C 16/345; C23C 16/36
See application file for complete search history.

(56) References Cited

U.S. PATENT DOCUMENTS

| 7,335,548 B2 | 2/2008 | Wang et al. |
| 8,440,571 B2 | 5/2013 | Weidman et al. |

(Continued)

FOREIGN PATENT DOCUMENTS

| KR | 10-2013-0064766 A | 6/2013 |
| KR | 10-1795288 B1 | 2/2017 |

(Continued)

OTHER PUBLICATIONS

Office Action for Korean Application No. 10-2020-0122830 dated Oct. 30, 2024.

*Primary Examiner* — Jay C Kim
*Assistant Examiner* — Woo K Lee
(74) *Attorney, Agent, or Firm* — Harness, Dickey & Pierce, P.L.C.

(57) ABSTRACT

A semiconductor device manufacturing method includes loading a semiconductor substrate into a chamber, the semiconductor substrate including a silicon oxide film, depositing a seed layer on the silicon oxide film by supplying a first silicon source material, supplying a purge gas on the seed layer, depositing a protective layer on the seed layer by repeating a first cycle, the first cycle including supplying a base source material layer and subsequently supplying the first silicon source material, and depositing a silicon nitride film on the protective layer by repeating a second cycle, the second cycle including supplying a second silicon source material and subsequently supplying a nitrogen source material.

18 Claims, 33 Drawing Sheets

(51) Int. Cl.
    *C23C 16/36*     (2006.01)
    *C23C 16/455*    (2006.01)

(56)             References Cited

U.S. PATENT DOCUMENTS 9,390,912  B2     7/2016   Murakami et al.
    9,620,357  B2     4/2017   Hashimoto et al.
    9,881,789  B2     1/2018   Hashimoto et al.
    9,994,956  B2 *   6/2018   Wu .................. H01L 21/67173
    2006/0102076  A1  5/2006   Smith et al.
    2009/0286402  A1* 11/2009  Xia ...................... H01L 21/318
                                                      257/E21.249
    2013/0113102  A1  5/2013   Bao et al.
    2017/0207135  A1  7/2017   Lee et al.
    2018/0033608  A1  2/2018   Miyahara et al.
    2019/0067006  A1* 2/2019   Hawrylchak ..... H01J 37/32724
    2019/0362961  A1  11/2019  Girard et al.
    2020/0006228  A1* 1/2020   Yang ................. H01L 21/76832
    2020/0361966  A1* 11/2020  Kim .......................... C07F 7/10

FOREIGN PATENT DOCUMENTS

KR    10-2017-0039567 A    4/2017
    KR    10-2018-0014661 A    2/2018
    KR    10-2018-0100772 A    9/2018

* cited by examiner

METHOD FOR MANUFACTURING SEMICONDUCTOR DEVICE INCLUDING AIR GAP

CROSS-REFERENCE TO THE RELATED APPLICATION

This application claims priority under 35 U.S.C. § 119 to Korean Patent Application No. 10-2020-0122830, filed on Sep. 23, 2020, in the Korean Intellectual Property Office, the disclosure of which is incorporated herein by reference in its entirety.

BACKGROUND

Some example embodiments of inventive concepts relate to a semiconductor device including an air gap and/or a method for manufacturing/fabricating the same, and more particularly to a semiconductor device including an air gap formed using a seed layer and/or a method for manufacturing/fabricating the same.

With increases in integration degree and down-scaling of a semiconductor devices such as Dynamic Random Access Memory (DRAM) devices in a semiconductor device, technology for forming an air gap in a bit line spacer is being applied. Upon formation of an air gap, a spacer made of, including, or consisting of an oxide is removed using a cleaning process. During this procedure, a cleaning material may penetrate into a pin hole formed at a spacer made of a nitride. As a result, there may be a problem in that a phenomenon in which the resultant spacer bursts may occur.

SUMMARY

Some example embodiments of inventive concepts provide a semiconductor device including an air gap formed using a seed layer.

Some example embodiments of inventive concepts provide a method for manufacturing a semiconductor device including a relatively thin bit line spacer while securing a large, e.g., a maximum air gap margin without failure, through use of a seed layer.

A method for manufacturing a semiconductor device in accordance with some example embodiments of inventive concepts includes loading a semiconductor substrate into a chamber, the semiconductor substrate including a silicon oxide film, depositing a seed layer on the silicon oxide film by supplying a first silicon source material, supplying a purge gas on the seed layer, depositing a protective layer on the seed layer by repeating a first cycle, the first cycle including supplying a base source material layer and subsequently supplying the first silicon source material, and depositing a silicon nitride film on the protective layer by repeating a second cycle, the second cycle including supplying a second silicon source material and subsequently supplying a nitrogen source material.

A method for manufacturing a semiconductor device in accordance with some example embodiments of inventive concepts includes forming a first impurity region on a substrate and a second impurity region on the substrate, recessing the first impurity region, to form a contact recess, forming a bit line structure extending in the contact recess in one direction, the bit line structure contacting the first impurity region, the bit line structure having a first side wall and a second side wall, forming an inner spacer on the first side wall and the second side wall of the bit line structure, forming a recess filler in the contact recess, forming a sacrificial spacer on the inner spacer and on the recess filler, forming an outer spacer on the sacrificial spacer, forming a storage node contact contacting the second impurity region, the contacting the second impurity region at an outside of the outer spacer, partially removing the sacrificial spacer and the outer spacer, to form an air gap between the outer spacer and the inner spacer, forming a landing pad on the storage node contact, forming a trench defining the landing pad, the forming the trench exposing an upper surface of the sacrificial spacer, and forming a pad isolation insulating layer filling the trench. The forming the outer spacer comprises depositing a seed layer using a first silicon source material, supplying a purge gas on the seed layer, depositing a protective layer on the seed layer by repeating a first cycle comprising supplying a carbon source material and supplying the first silicon source material, and depositing a preliminary main spacer on the protective layer by repeating a second cycle comprising supplying a second silicon source material and supplying a first nitrogen source material.

A method for manufacturing a semiconductor device in accordance with some example embodiments of inventive concepts includes forming a first impurity region on a substrate and a second impurity region on the substrate, recessing the first impurity region, to form a contact recess, forming a bit line structure extending in the contact recess in one direction, the bit line structure contacting the first impurity region, the bit line structure having a first side wall and a second side wall, forming an inner spacer on each of the first side wall and the second side wall of the bit line structure, forming a recess filler in the contact recess, forming a capping spacer on the inner spacer and the recess filler, forming a sacrificial spacer on the capping spacer, forming a protective spacer on the sacrificial spacer, forming a storage node contact contacting the second impurity region at an outside of the main spacer, removing the sacrificial spacer, to form an air gap between the capping spacer and the protective spacer, forming a landing pad on the storage node contact, forming a trench defining the landing pad while exposing an upper surface of the sacrificial spacer, and forming a pad isolation insulating layer filling the trench. The forming the capping spacer comprises depositing a capping layer by repeating a first cycle comprising supplying a first silicon source material, supplying a first base source material, and supplying a nitrogen source material. The forming the protective spacer comprises depositing a protective layer by repeating a second cycle comprising supplying the first silicon source material, supplying a second base source material and supplying the nitrogen source material.

BRIEF DESCRIPTION OF THE DRAWINGS

The above and other aspects and features of inventive concepts will become more apparent by describing in detail some example embodiments thereof with reference to the attached drawings, in which.

DETAILED DESCRIPTION OF SOME EXAMPLE EMBODIMENTS

Figure 1:
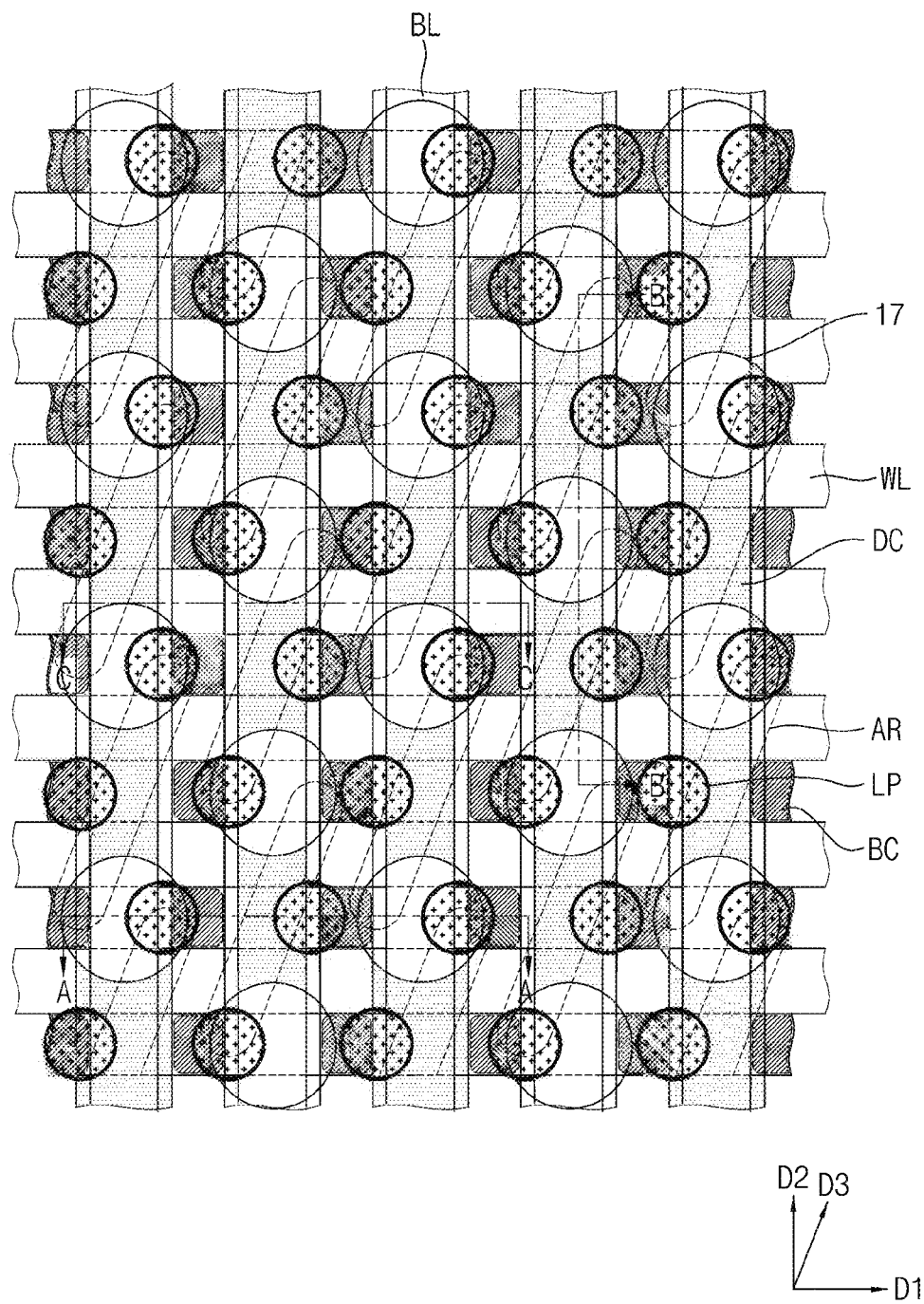
FIG. 1 illustrates a schematic planar layout of a semiconductor device according some example embodiments of inventive concepts.

FIG. 1 is a schematic planar layout of a semiconductor device according some example embodiments of inventive concepts.

Referring to FIG. 1, the semiconductor device according to some example embodiments of inventive concepts may include word lines WL extending in parallel in a first direction D1, bit lines BL extending in parallel in a second direction D2, active regions AR extending in a third direction D3 while having an island shape when viewed in a plan view/top view, and landing pads LP each overlapping with opposite lateral ends of adjacent ones of the active regions AR. Directions D1 and D2 may be at right angles to one another; however, example embodiments are not limited thereto. Furthermore direction D3 may be at an angle other than a right angle with respect to direction D1, for example at an angle of 70 degrees with respect to direction D1; however, example embodiments are not limited thereto. A plurality of active regions AR may collinearly extend in the third direction D3.

Two word lines WL may extend across one active region AR. For example, the word lines WL may be disposed such that each active region AR is divided, e.g. trisected, by corresponding ones of the word lines WL. One bit line BL may extend across one active region AR. The bit lines BL may be disposed to pass through central portions of the active regions AR, respectively. For example, the bit lines WL may be disposed such that each active region AR is divided, e.g. bisected, by a corresponding one of the bit lines WL.

Figure 2A:
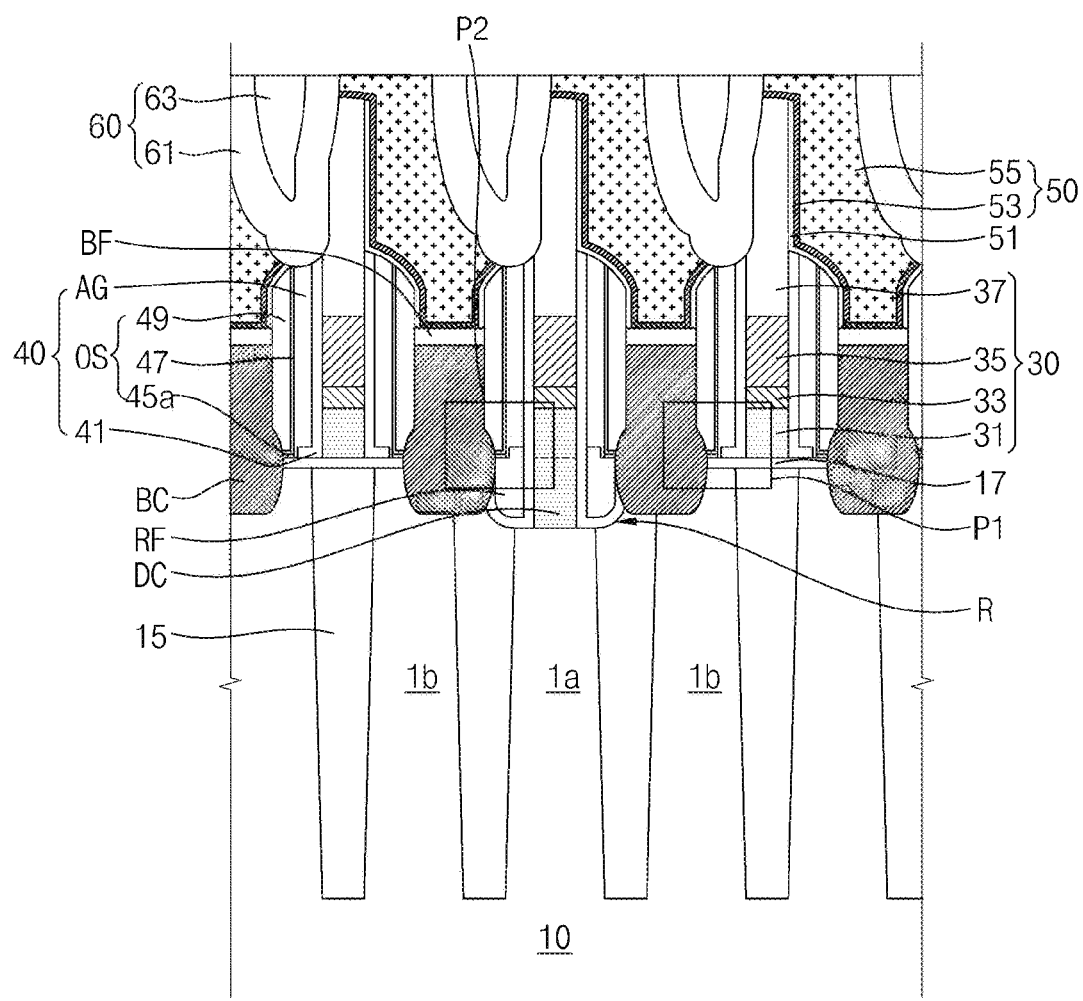
FIG. 2A illustrates a cross-sectional view of the semiconductor device according to some example embodiments of inventive concepts taken along line A-A' of FIG. 1.
Figure 2B:
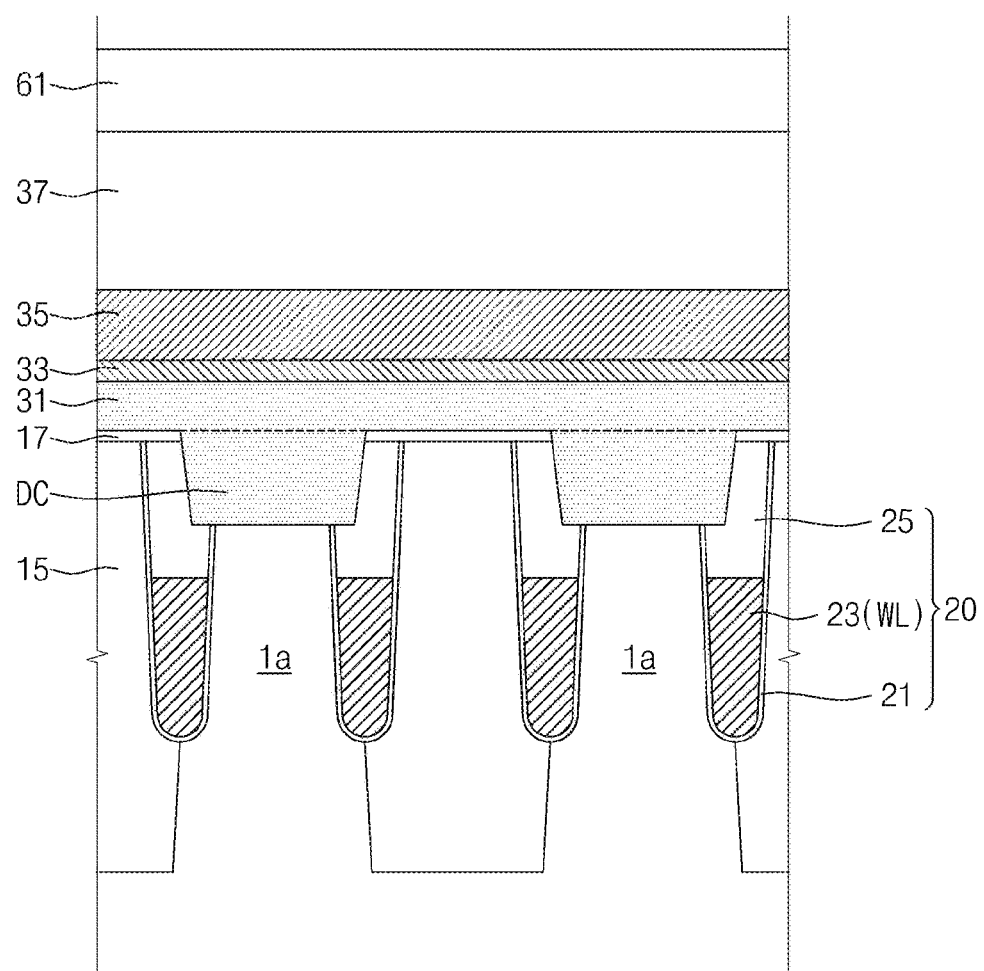
FIG. 2B illustrates a cross-sectional view of the semiconductor device according to some example embodiments of inventive concepts taken along line B-B' of FIG. 1.
Figure 2C:
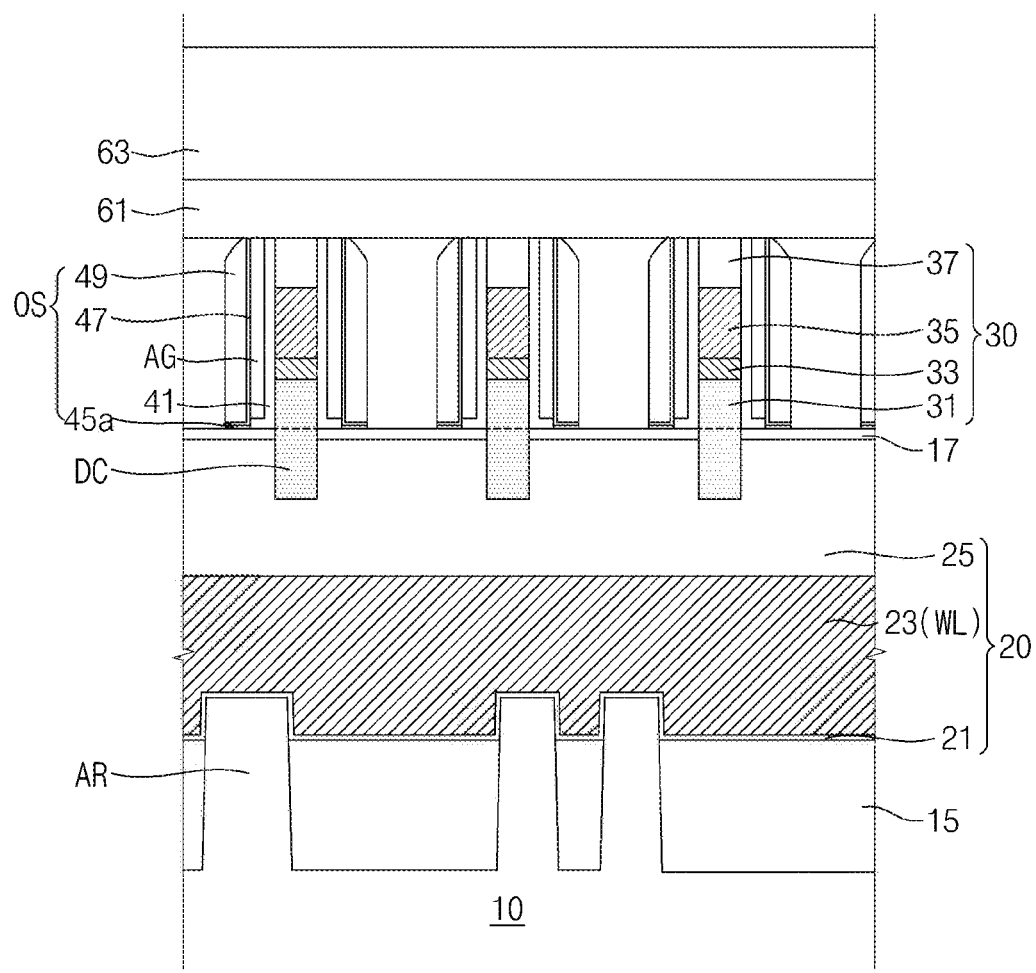
FIG. 2C illustrates a cross-sectional view of the semiconductor device according to some example embodiments of inventive concepts taken along line C-C' of FIG. 1.
Figure 3A:
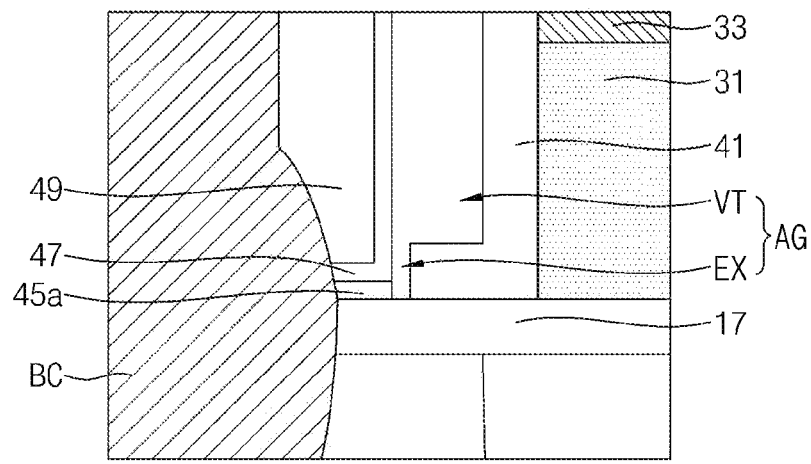
FIG. 3A illustrates an enlarged view of a region P1 in FIG. 2A.
Figure 3B:
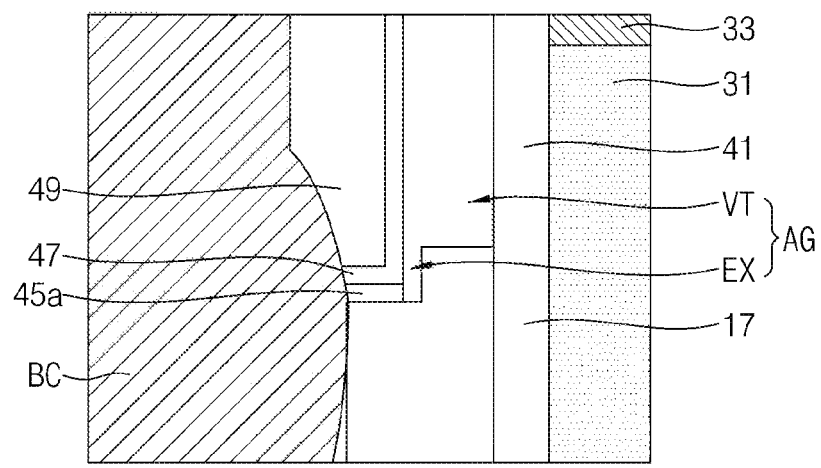
FIG. 3B illustrates an enlarged view of a region P2 in FIG. 2A.

FIG. 2A is a cross-sectional view of the semiconductor device according to some example embodiments of inventive concepts taken along line A-A' of FIG. 1. FIG. 2B is a cross-sectional view of the semiconductor device according to some example embodiments of inventive concepts taken along line B-B' of FIG. 1. FIG. 2C is a cross-sectional view of the semiconductor device according to some example embodiments of inventive concepts taken along line C-C' of FIG. 1. FIG. 3A is an enlarged view of a region P1 in FIG. 2A. FIG. 3B is an enlarged view of a region P2 in FIG. 2A.

Referring to FIGS. 1, 2A, 2B, 2C, 3A and 3B, the semiconductor device may include a substrate 10. The substrate 10 may be a semiconductor substrate made of, comprising, or consisting of a semiconductor material such as silicon, germanium, silicon-germanium, a Group III-V composite semiconductor material, etc. The substrate 10 may be doped, e.g. may be lightly doped with at least one of boron, phosphorus, or arsenic; however, example embodiments are not limited thereto.

An element isolation layer 15 may be disposed in/within the substrate 10, and may define the active regions AR. The element isolation layer 15 may have the form of a dam filling a trench formed in the substrate 10. The element isolation layer 15 may be or include a shallow trench isolation (STI) layer formed in the substrate 10, and may be formed with a deposition process such as a high-density plasma (HDP) deposition process and/or a spin-on glass (SOG) process; however, example embodiments are not limited thereto.

The active regions AR may be two-dimensionally arranged in the first direction D1 and the second direction D2. When viewed in a top view, the active regions AR may be arranged to have a zigzag form. Each of the active regions AR may have a bar shape/island shape, and may have a longer axis in the third direction D3 that is a direction inclined from the first direction D1 and the second direction D2. A first impurity region 1a and a second impurity region 1b may be formed in each active region AR. The first and second impurity regions 1a and 1b may be formed to have a specific (or, alternatively, predetermined) depth from the active region AR. The first impurity region 1a may be formed at a central portion of the active region AR. The second impurity region 1b may be formed at each of opposite ends of the active region AR while being spaced apart from the first impurity region 1a. The first and second impurity regions 1b may be doped with dopants having opposite conductivity types, respectively. For example, the first impurity region 1a may be doped with phosphorous and/or arsenic, and the second impurity region 1b may be doped with boron; however, example embodiments are not limited thereto. Either or bother of a depth of impurities and a concentration of impurities may be the same as, or may be different between, the first impurity region 1a and the second impurity region 1b. The first impurity region 1a and the second impurity region 1b may be formed with an implantation process such as an beamline ion implantation process and/or a plasma assisted doping (PLAD) implantation process; however, example embodiments are not limited thereto.

Word lines 23 (WL) may be disposed in the active regions AR of the substrate 10. A pair of word lines 23 (WL) may extend across one active region AR in the first direction D1. The word lines 23 (WL) may be buried in the active region AR of the substrate 10. For example, upper surfaces of the word lines 23 (WL) may be disposed at a lower level than an upper surface of the substrate 10. Each word line 23 (WL) may include a conductive material. For example, each word line 23 (WL) may include at least one of undoped polysilicon, doped polysilicon, a metal material, or a metal silicide material.

A gate insulating film 21 may be disposed between the word lines 23 (WL) and the substrate 10. The gate insulating film 21 may include, for example, silicon oxide. The gate insulating film 21 may be formed with a deposition process and/or an oxidation process, such as a thermal oxidation process and/or an in-situ steam generation (ISSG) process. A gate capping layer 25 may be disposed between the upper surfaces of the word lines 23 (WL) and the upper surface of the substrate 10. An upper surface of the gate capping layer 25 may be disposed at the same level as the upper surface of the substrate 10. A lower surface of the gate capping layer 25 may contact the upper surfaces of the word lines 23 (WL) and an upper surface of the gate insulating film 21. For example, the gate capping layer 25 may include or consist of silicon oxide and/or silicon nitride.

An interlayer insulating layer 17 may be disposed on a surface of the substrate 10. The interlayer insulating layer 17 may partially cover a surface of the element isolation layer 15. The interlayer insulating layer 17 may be or include one or more of silicon oxide, silicon nitride, and combinations of various other insulating materials.

A contact recess R may be formed on each active region AR and the element isolation layer 15 adjacent to the active region AR. The contact recess R may be recessed inwards from the surface of the substrate 10. A recess filler RF may be disposed in the contact recess R. The recess filler RF may include an insulating material such as at least one of silicon oxide or silicon nitride.

Bit line structures 30 may each include a bit line contact 31, a bit line barrier layer 33, a bit line 35 (BL), and a bit line capping layer 37. Opposite side walls of the bit line contact 31, the bit line barrier layer 33, the bit line 35 (BL) and the bit line capping layer 37 may be vertically aligned. The bit line contact 31 may be disposed on the interlayer insulating layer 17. A direct contact DC, which is a portion of the bit line contact 31, may be disposed in the contact recess R of a corresponding one of the active regions AR, and may be connected, e.g. directly connected to the first impurity region 1a of the corresponding active region AR. Accordingly, the bit line barrier layer 33 and the bit line 35 (BL) may be electrically connected through the bit line contact 31. The bit line barrier layer 33 may include a barrier metal such as titanium nitride (TiN). The bit line 35 (BL) may include metal such as tungsten (W). The bit line capping layer 27 may include an oxidation-resistant insulating material having high density such as silicon nitride.

Storage node contacts BC may each be disposed between adjacent ones of the bit line structures 30. Each storage node contact BC may extend along side walls of the corresponding bit line structures 30 in the second direction D2. When viewed in a top view, each storage node contact BC may be disposed between the corresponding word lines WL and the corresponding bit line structures 30. For example, each storage node contact BC may include polysilicon doped with an impurity such as at least one of boron, phosphorus, or arsenic; alternative or additionally, the storage node contact BC may include a metal such as tungsten.

Each storage node contact BC may connect, e.g. directly contact the second impurity region 1b of the corresponding active region AR. A lower end of the storage node contact BC may be disposed below the upper surface of the substrate 10 while being disposed above a lower surface of each of the corresponding bit line contacts 31. The storage node contact BC may be insulated and/or isolated from the bit line contacts 31 by the corresponding recess filler RF. An upper surface of the storage node contact BC may be disposed below each of the corresponding bit lines 35 (BL).

A bit line spacer 40 may be disposed between each bit line structure 30 and each storage node contact BC disposed adjacent to each other. The bit line spacer 40 may extend in the second direction D2 while covering a side wall of the bit line structure 30. The bit line spacer 40 may include an inner spacer 41, an air gap AG, and an outer spacer OS.

The inner spacer 41 may conformally cover a side surface of the corresponding bit line structure 30. The inner spacer 41 may extend into the corresponding contact recess R, and may have a concave shape such as a U shape extending along a side wall of the corresponding bit line contact 21 and a surface of the contact recess R. The recess filler RF corresponding to the contact recess R may be disposed on the inner spacer 41 in the contact recess R.

The outer spacer OS may be disposed between the storage node contact BC and the inner spacer 41. In some example embodiments, the outer spacer OS may include a seed pattern 45a, a protective spacer 47, and a main spacer 49.

The main spacer 49 may be disposed between the inner spacer 41 and the storage node contact BC. An outer side surface of the main spacer 49 may contact the storage node contact BC. The main spacer 49 may be spaced apart from the inner spacer 41. The main spacer 49 may be spaced apart from the interlayer insulating layer 17 and the recess filler RF. The thickness of the main spacer 49 may be greater than the thickness of the inner spacer 41. In some example embodiments, the inner spacer 41 and the main spacer 49 may include, e.g. may consist of, the same material. For example, the inner spacer 41 and the main spacer 49 may include SiN.

The protective spacer 47 may be disposed on the seed pattern 45a while conformally covering inner side and bottom surfaces of the main spacer 49. The protective spacer 47 may completely cover an upper surface of the seed pattern 45a. The protective spacer 47 may define opposite sides of the air gap AG together with the inner spacer 41. The protective spacer 47 may be or include a silicon thin film including carbon and/or nitrogen. In some example embodiments, the thickness of the protective spacer 47 may be 20 Å (2 nm) or less. For example, the thickness of the protective spacer 47 may be about 1 to 20 Å (0.1 nm to 2 nm). For example, the protective spacer 47 may include at least one of SiC, SiCN and SiBN.

The seed pattern 45a may be interposed between the recess filler RF and the protective spacer 47. The seed pattern 45a may be interposed between the interlayer insulating layer 17 and the protective spacer 47. One end of the seed pattern 45a may be exposed through the air gap AG. The one end of the seed pattern 45a may be aligned with an inner side surface of the protective spacer 47. The other end of the seed pattern 45a may contact the storage node contact BC. The seed pattern 45a may be a silicon thin film not including carbon and nitrogen. The seed pattern 45a may be or include a thin film and, as such, may have a thickness of 20 Å (2 nm) or less. For example, the thickness of the seed spacer 45 may be about 1 to 20 Å (0.1 nm to 2 nm).

The air gap AG may be disposed between the inner spacer 41 and the protective spacer 47. For example, the width of the air gap AG may be defined by an outer side surface of the inner spacer 41 and the inner side surface of the protective spacer 47. A lower end of the air gap AG may be defined by the recess filler RF and the inner spacer 41. An upper end of the air gap AG may be defined by a pad isolation insulating layer 60. In some example embodiments, the thickness of the air gap AG may be substantially equal to or greater than the thickness of the inner spacer 41. The thickness of the air gap AG may be smaller than the thickness of the main spacer 49. The air gap AG may be under pressure, e.g. may have a pressure less than that of atmospheric pressure; alternatively or additionally, the air gap AG may include a gas, such as clean, dry air (CDA).

The bit line spacer 40 may further include a capping pattern 51. The capping pattern 51 may cover upper ends of the inner spacer 41, the air gap AG and the outer spacer OS. The capping pattern 51 may define an upper end of a portion of the air gap AG. The capping pattern 51 may partially cover a side wall of the corresponding bit line capping layer 37.

The semiconductor device may further include a buffer layer BF disposed on the storage node contact BC. For example, the buffer layer BF may include at least one of tungsten silicide (W—Si), titanium silicide (Ti—Si), tantalum silicide (Ta—Si), nickel silicide (Ni—Si), cobalt silicide (Co—Si), and other various metal silicides. In some example embodiments, the buffer layer BF may include a barrier layer such as titanium nitride (TiN).

A landing pad structure 50 may be disposed on the storage node contact BC and the buffer layer BF. The landing pad structure 50 may be electrically connected to the storage node contact BC. The landing pad structure 50 may include a landing pad barrier layer 53 and a landing pad 55 (LP). The landing pad barrier layer 53 may cover, e.g. may conformally cover a portion of an upper surface of the bit line structure BL, an upper surface of the buffer layer BF, and a surface of the capping pattern 51. The landing pad barrier layer 53 may include a barrier metal such as titanium nitride (TiN). The landing pad 55 (LP) may be disposed on the landing pad barrier layer 53 in the form of a plug. The landing pad 55 (LP) may be made of, include, or consist of metal nitride such as titanium nitride and/or tantalum nitride and/or a metal material such as tungsten.

The pad isolation insulating layer 60 may be disposed between adjacent ones of landing pads 55 (LP). The pad isolation insulating layer 60 may include a first pad isolation insulating layer 61 and a second pad isolation insulating layer 63. The first pad isolation insulating layer 61 may surround outer walls of the landing pads 55 (LP). The first pad isolating insulating layer 61 may physically and/or electrically isolate the landing pads 55 (LP) from one another. A lower end of the first pad isolation insulating layer 61 may contact an upper end of the bit line spacer 40. A lower end of the first pad isolation insulating layer 61 may define an upper end of a portion of the air gap AG. The second pad isolation insulating layer 63 may be interposed between portions of the first pad isolation insulating layer 61. For example, the first pad isolation insulating layer 61 may include SiN and may not include SiCN, whereas the second pad isolation insulating layer 63 may include SiCN and may not include SiN.

Referring to FIGS. 2A, 3A and 3B, the air gap AG may have separate portions, e.g. may include an air spacer VT and an extension EX. The air spacer VT may be disposed on the recess filler RF and the inner spacer 41 while being disposed on the interlayer insulating layer 17 and the inner spacer 41. The width of the air spacer VT may correspond to a distance between the protective spacer 47 and the inner spacer 41. The extension EX may have a shape protruding downwards from a lower end of the air spacer VT. The extension EX may extend between the recess filler RF and the protective spacer 47 and between the recess filler RF and the seed pattern 45a. The extension EX may extend between the inner spacer 41 and the protective spacer 47 and between the inner spacer 41 and the seed pattern 45a. The width of the extension EX may be substantially equal to the thickness of the seed pattern 45a.

Figure 4:
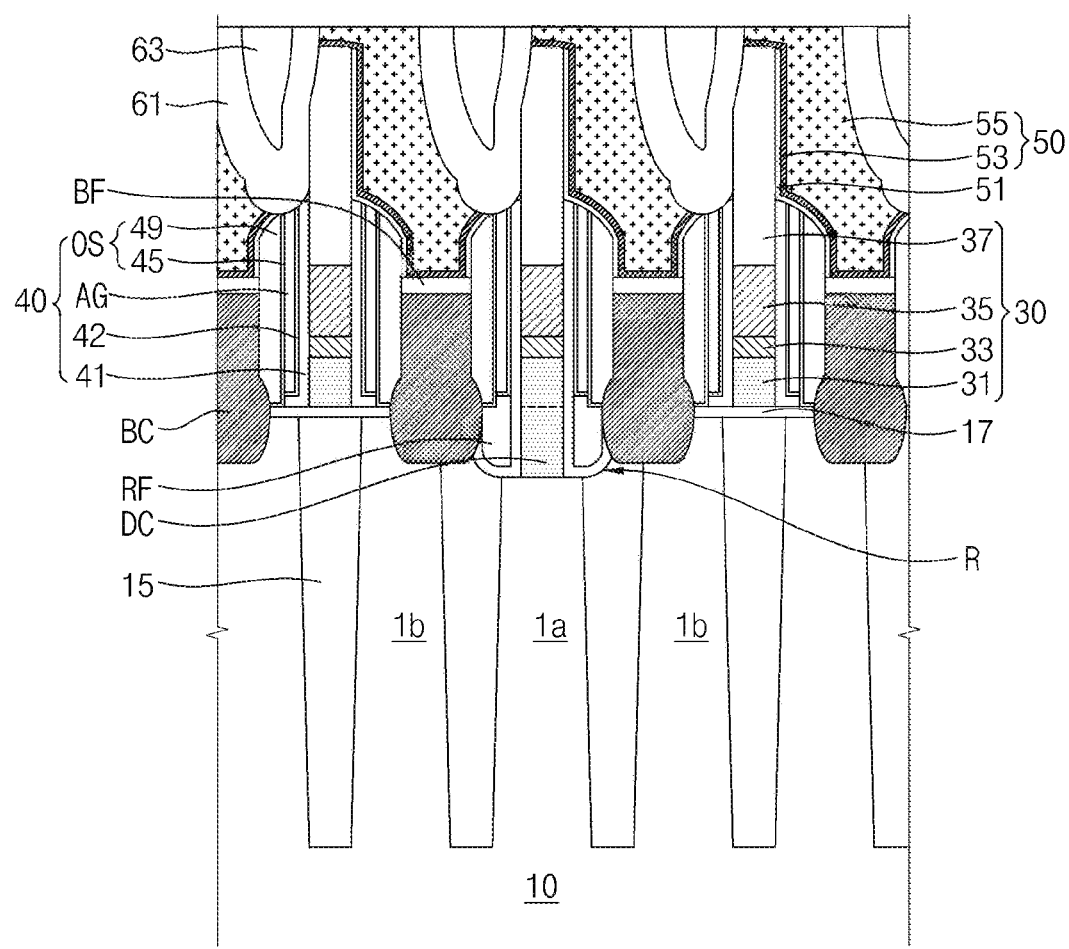
FIG. 4 illustrates a cross-sectional view of a semiconductor device according to some example embodiments of inventive concepts taken along line A-A' of FIG. 1.

FIG. 4 is a cross-sectional view of a semiconductor device according to some example embodiments of inventive concepts taken along line A-A' of FIG. 1.

Referring to FIG. 4, a bit line spacer 40 may include an inner spacer 41, a capping spacer 42, an air gap AG, and an outer spacer OS.

The capping spacer 42 may be disposed on the inner spacer 41 and a recess filler RF. The capping spacer 42 may conformally cover an inner side surface of the inner spacer 41. The capping spacer 42 may define opposite sides of the air gap AG together with the seed space of the outer spacer OS. The capping spacer 42 may define a bottom surface of the air gap AG. A bottom surface of the capping spacer 42 may be disposed at a higher level than a bottom surface of the seed spacer 45. In addition, the bottom surface of the capping spacer 42 may be disposed at a higher level than a bottom surface of the main spacer 49.

The outer spacer OS may include the seed spacer 45 and the main spacer 49. The seed spacer 45 may be disposed between the air gap AG and the main spacer 49. The seed spacer 45 may be disposed between the capping spacer 42 and the main spacer 49. The seed spacer 45 may cover, e.g. conformally cover inner side and bottom surfaces of the main spacer 49. The seed spacer 45 may extend between the recess filler RF and the main spacer 49. The seed spacer 45 may extend between an interlayer insulating layer 17 and the main spacer 49.

The thickness of the capping spacer 42 may be substantially equal to the thickness of the seed spacer 45; however, example embodiments are limited thereto. In some example embodiments, each of the seed spacer 45 and the capping spacer 42 may have a thickness of 20 Å (2 nm) or less. For example, each of the seed spacer 45 and the capping spacer 42 may have a thickness of 1 to 20 Å (0.1 nm to 2 nm). The capping spacer 42 and the seed spacer 45 may include the same material. For example, both the capping spacer 42 and the seed spacer 45 may include SiCN. In some example embodiments, the capping spacer 42 and the seed spacer 45 may include different materials, respectively. For example, the capping spacer 42 may include at least one of SiC and SiBN, whereas the seed spacer 45 may include SiCN and may not include either or both of SiC and SiBN. Alternatively, the capping spacer 42 may include SiCN, whereas the seed spacer 45 may include at least one of SiC and SiCN.

Figure 5:
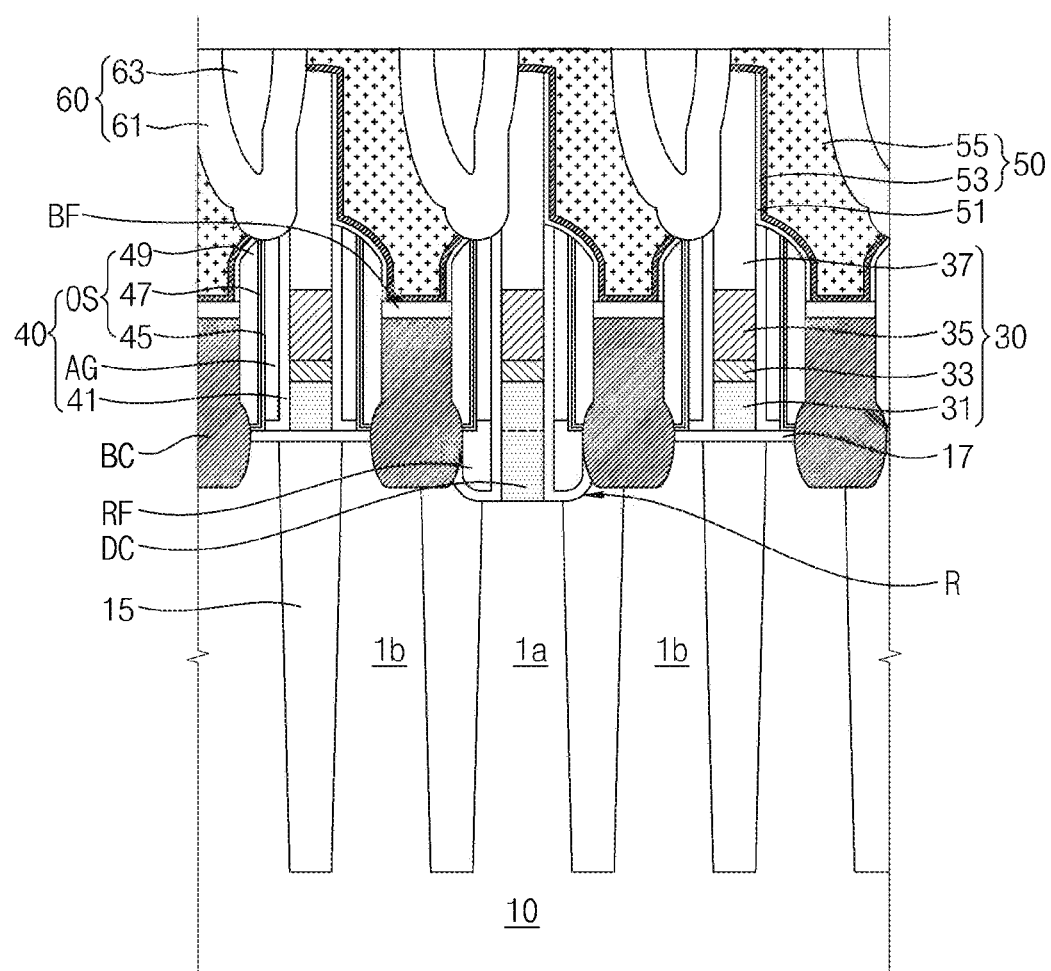
FIG. 5 illustrates a cross-sectional view of a semiconductor device according to some example embodiments of inventive concepts taken along line A-A' of FIG. 1.

FIG. 5 is a cross-sectional view of a semiconductor device according to some example embodiments of inventive concepts taken along line A-A' of FIG. 1.

Referring to FIG. 5, an outer spacer OS may include a seed spacer 45, a protective spacer 47 and a main spacer 49. The protective spacer 47 may be disposed on the seed spacer 45 while being disposed between the seed spacer 45 and the main spacer 49. The protective spacer 47 may cover, e.g. conformally cover inner side and bottom surfaces of the main spacer 49. The seed spacer 45 may be spaced apart from the main spacer 49 by the protective spacer 47. The protective spacer 49 may be spaced apart from an interlayer insulating layer 17, a recess filler RF, and an inner spacer 41. The seed spacer 45 and the protective spacer 47 may have substantially the same thickness; however, example embodiments are not limited thereto. In some example embodiments, each of the seed spacer 45 and the protective spacer 47 may have a thickness of 20 Å (2 nm) or less. For example, each of the seed spacer 45 and the protective spacer 47 may have a thickness of about 1 to 20 Å (0.1 nm to 2 nm). For example, each of the seed spacer 45 and the protective spacer 47 may include at least one of SiC, SiCN and SiBN, and may include or consist of the same material. In some example embodiments, any one of the seed spacer 45 and the protective spacer 47 may include SiCN.

Example embodiments are not limited to those described above, and, unless clear from context, none of the embodiments are mutually exclusive to one another. For example, some embodiments may include features described with reference to one figure, and also features described with reference to another figure.

FIGS. 6 to 22 are sectional views explaining a method for forming a semiconductor device in accordance with some example embodiments of inventive concepts.

Figure 6:
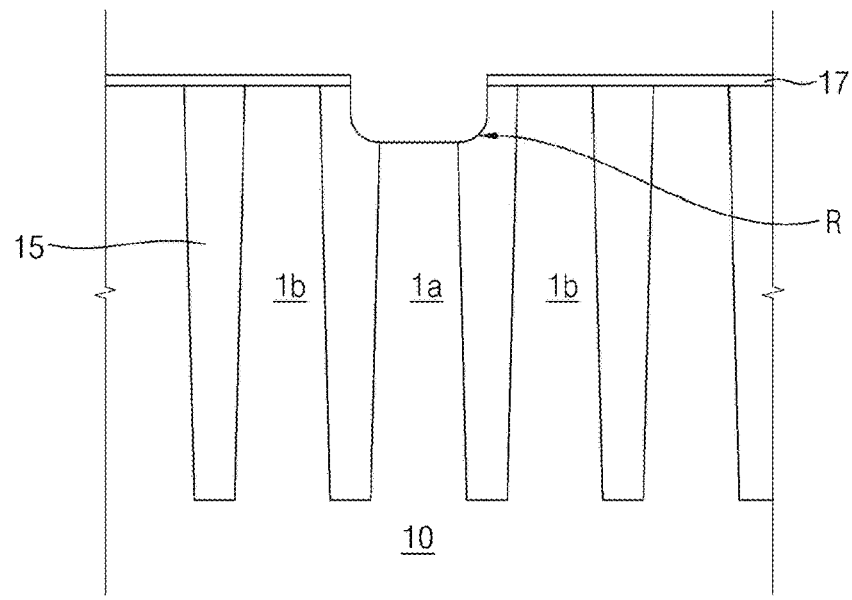
FIGS. 6 to 22 illustrate sectional views explaining a method for forming a semiconductor device in accordance with some example embodiments of inventive concepts.

Referring to FIG. 6, the method may include forming an element isolation layer 15 in a substrate 10, forming an interlayer insulating layer 17 on the substrate 10, and forming a contact recess R.

Formation of the element isolation layer 15 may include forming trenches in the substrate, and filling the trenches with an insulating material, such as oxide such as high density plasma (HDP) oxide and/or spin-on glass (SOG) oxide; however, example embodiments are not limited thereto. An active region AR may be defined by the element isolation layer 15.

Formation of the interlayer insulating layer 17 may include forming an insulating layer on a surface of the substrate 10 formed with the element isolation layer 15. The interlayer insulating layer 17 may cover an upper surface of the substrate 10 and an upper surface of the element isolation layer 15. The interlayer insulating layer 17 may expose a portion of the upper surface of the substrate 10 and a portion of the upper surface of the element isolation layer 15. The interlayer insulating layer 17 may include at least one of silicon oxide, silicon nitride and various insulating materials. The interlayer insulating layer 17 may be formed with a deposition process such as a chemical vapor deposition (CVD) process; however, example embodiments are not limited thereto.

Formation of the contact recess R may include recessing an upper portion of a first impurity region 1a of the substrate 10 using a selective etch process such as a selective wet etch process and/or a selective dry etch process. For example, the contact recess R may be formed as a part of an upper portion of the first impurity region 1a and a part of an upper portion of the element isolation layer 15, which are exposed by the interlayer insulating layer 17.

Figure 7:
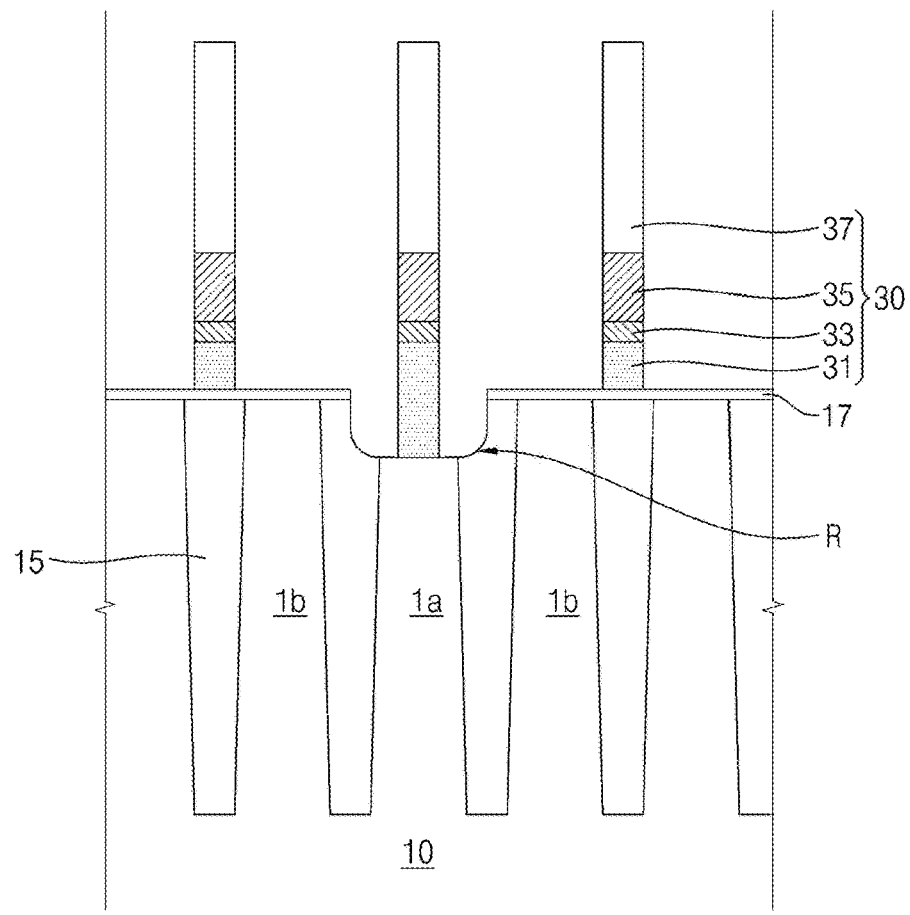

Referring to FIG. 7, the method may include forming bit line structures 30. Each bit line structure 30 may include a bit line contact 31, a bit line barrier layer 33, a bit line 35 (BL), and a bit line capping layer 37.

Formation of the bit line structure 30 may include forming a bit line contact material layer, a bit line barrier material layer, a bit line material layer, and a bit line capping material layer, and performing a patterning process. Each of the bit line contact material layer, the bit line barrier material layer, the bit line material layer, and the bit line capping material layer may be formed with a CVD process and/or a physical vapor deposition (PVD) process; however, example embodiments are not limited thereto. The patterning process may be or include a single-patterning process, or a double-patterning process, or a triple or quadruple patterning process; however, example embodiments are not limited thereto.

For example, the bit line contact 31 may include a conductor such as doped polycrystalline silicon. The bit line barrier layer 33 may include a barrier metal such as titanium nitride (TiN). The bit line 35 (BL) may include metal such as tungsten. The bit line capping layer 37 may include an oxidation-resistant insulating material having high density such as silicon nitride.

The bit line contact 31 on the first impurity region 1a may extend into the contact recess R such that the bit line contact 31 may contact the first impurity region 1a so as to be electrically connected thereto.

Figure 8:
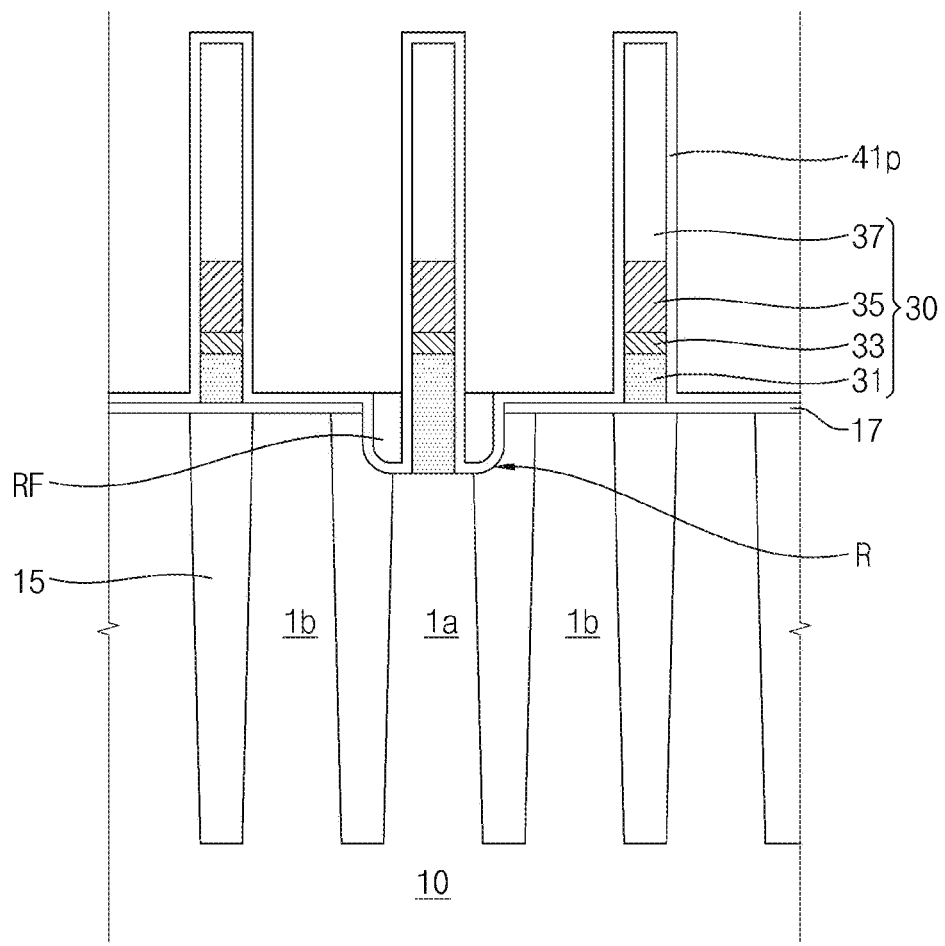

Referring to FIG. 8, the method may include forming a preliminary inner spacer 41p and a recess filler RF. The preliminary inner spacer 41p may be formed to partially fill the contact recess R while conformally covering the bit line structure 30. Formation of the recess filler RF may include forming an insulating layer conformally covering the preliminary inner spacer 41p, and anisotropically etching the insulating layer. The insulating layer may be formed with a CVD process, and the insulating layer may be etched with a dry etching process; however, example embodiments are not limited thereto. The recess filler RF may be formed to fill the contact recess R while being coplanar with the interlayer insulating layer 17. For example, the preliminary inner spacer 41p may include silicon nitride, whereas the recess filler RF may include silicon oxide, silicon nitride or various insulating materials.

Figure 9:
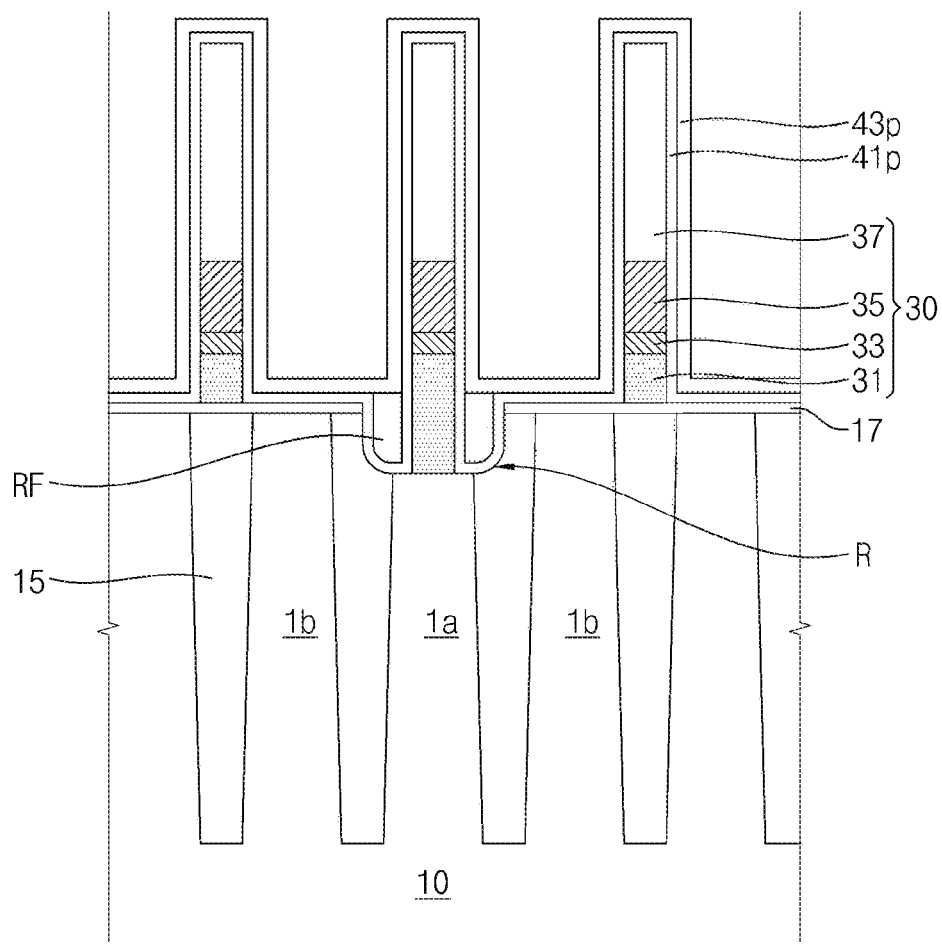

Referring to FIG. 9, the method may include forming a preliminary sacrificial spacer 43p. The preliminary sacrificial spacer 43p may be formed to conformally cover the preliminary inner spacer 41p. In some example embodiments, the preliminary sacrificial spacer 43p may be formed to have a thickness substantially equal to or slightly greater than the thickness of the preliminary inner spacer 41p. For example, the preliminary sacrificial spacer 43p may include silicon oxide.

Figure 10:
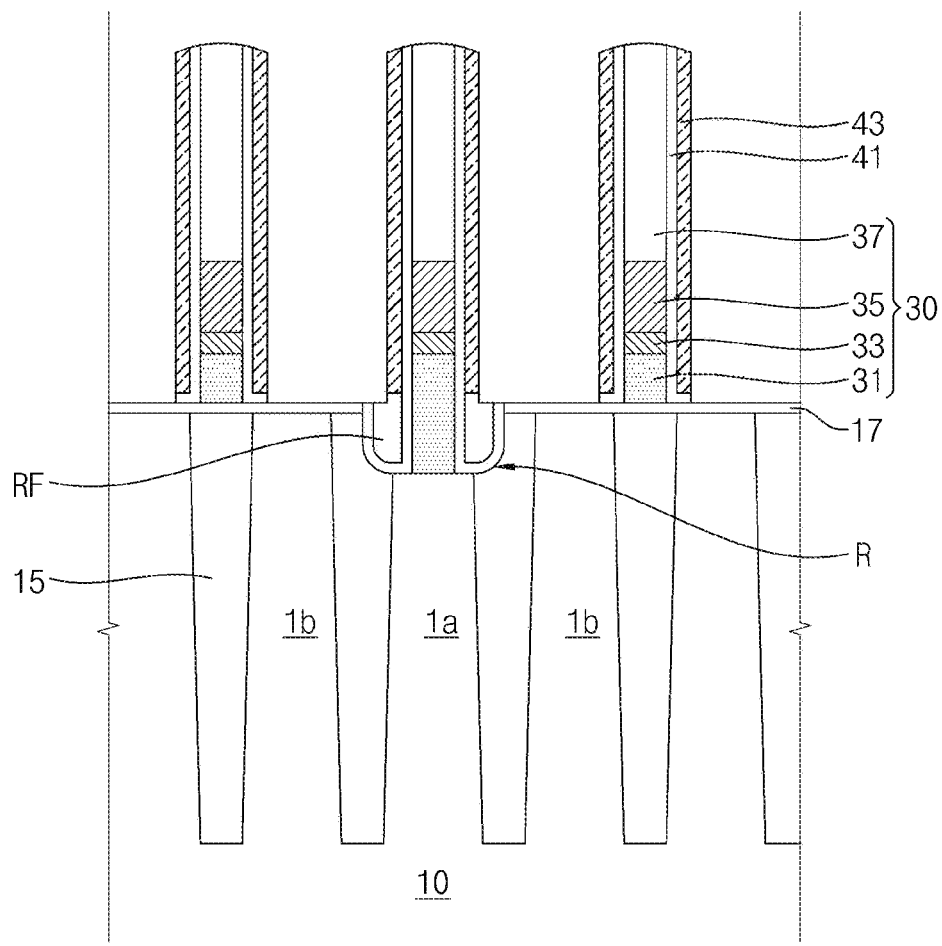

Referring to FIG. 10, the method may include forming an inner spacer 41 and a sacrificial spacer 43. The inner spacer 41 and the sacrificial spacer 43 may be formed on each outer side wall, e.g. a first a second side wall, of the bit line structure 30 through anisotropic etching of the preliminary inner spacer 41p and the preliminary sacrificial spacer 43p.

Figure 11:
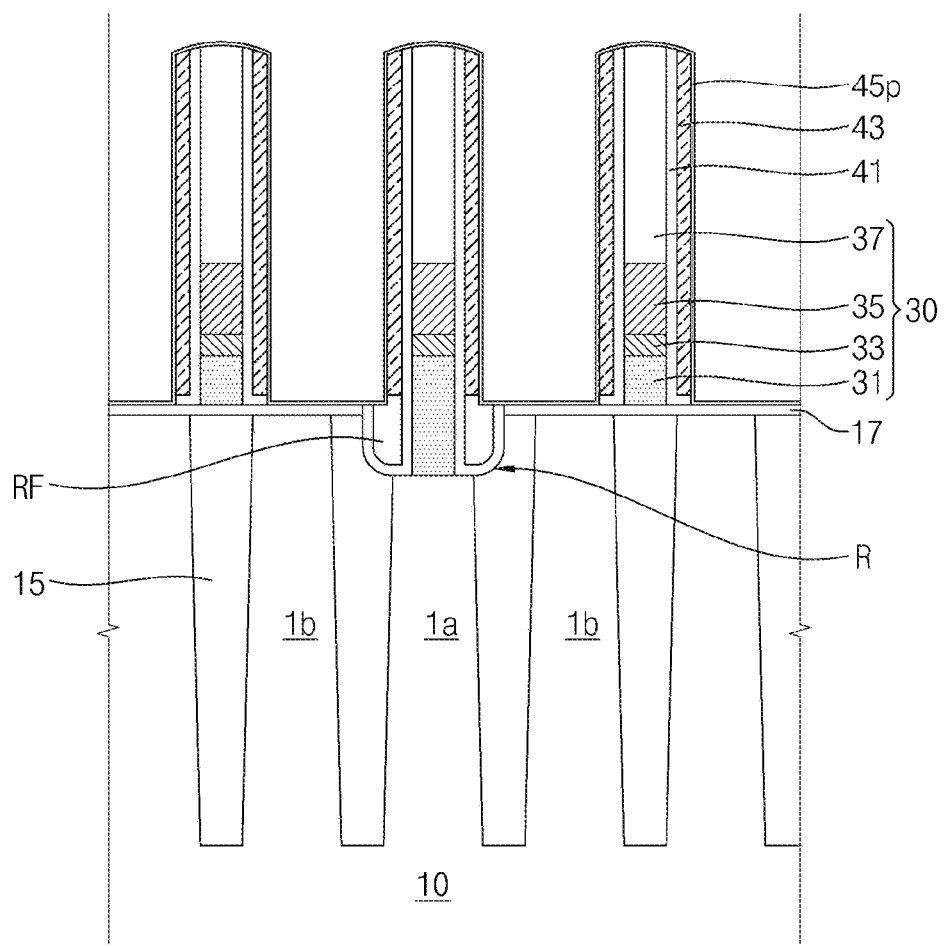

Referring to FIG. 11, the method may include forming a seed layer 45p on the sacrificial spacer 43. The seed layer 45p may conformally cover an upper surface of the interlayer insulating layer 17, a surface of the inner spacer 41, a surface of the recess filler RF, a surface of the sacrificial spacer 43 and a surface of the bit line capping layer 37. In some example embodiments, the seed layer 45p may be formed through an atomic layer deposition (ALD) process, using a silicon source material. The seed layer 45p may be formed into a silicon film having the form of a thin film without including either or both of carbon or nitrogen. The seed layer 45p may be formed to have a thickness of 20 Å (2 nm) or less. For example, the seed layer 45p may be formed to have a thickness of 1 to 20 Å (0.1 nm to 2 nm). For example, the silicon source material may be or include a halogen-substituted silane-based silicon precursor such as at least one of hexachlorodisilane (HCD), dichlorosilane (DCS), disilane (DS), trichlorosilane (TCS: $SiCl_3H$), etc. Alternatively or additionally, the silicon source material may be a silane-based silicon source material not including carbon or nitrogen, as expressed by the following Chemical Formula 1:

$$Si_nH_{2(N-1)+4} \qquad \text{[Chemical Formula 1]}$$

Figure 12:
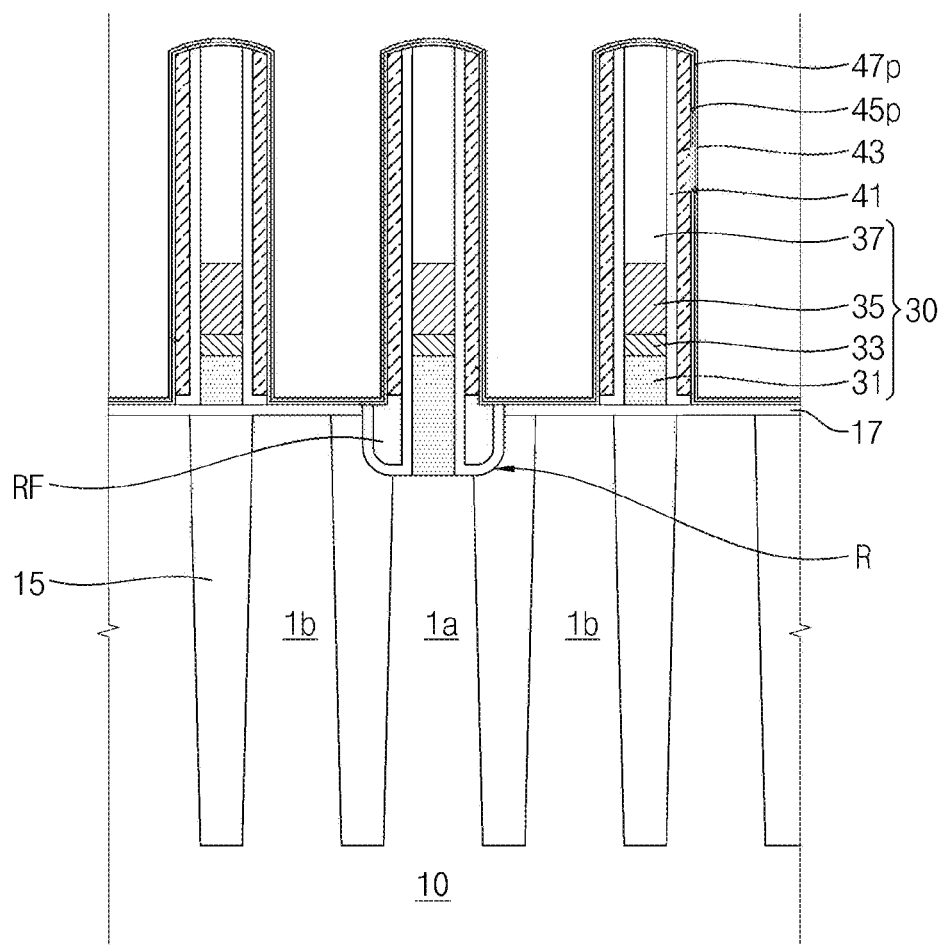

Referring to FIG. 12, the method may further include forming a protective layer 47p on the seed layer 45p. The protective layer 47p may conformally cover a surface of the seed layer 45p. For example, the protective layer 47p may include at least one of SiC, SiBN, or SiCN. The protective layer 47p may take the form of a thin film through an atomic layer deposition (ALD) process, using at least one of a silicon source material, a nitrogen source material, a carbon source material and/or a boron source material. The protective layer 47p may be formed to have a thickness of 20 Å (2 nm) or less. For example, the protective layer 47p may be formed to have a thickness of about 1 to 20 Å (0.1 nm to 2 nm). For example, the protective layer 47p, which includes SiC, may be formed through repeated execution of a cycle including introduction of a silicon source material and introduction of a carbon source material.

For example, as the silicon source material, the same material as the silicon source material used in formation of the seed layer 45p may be used. The nitrogen source material may be at least one of $N_2$, $NH_3$, hydrazine ($N_2H_4$), plasma $N_2$, remote plasma $N_2$, or a combination thereof. The carbon source material may be an organic material such as $C_2H_4$. The boron source material may be a halogen-substituted borane-based boron precursor such as diborane ($B_2H_6$).

The protective layer 47p may cover the seed layer 45p, thereby preventing, or reducing the likelihood of, intermixing between the seed layer 45p and a preliminary main spacer 49p which will be subsequently formed. In addition, as the protective layer 47p is not formed on the sacrificial spacer 43, but is formed on the seed layer 45p, an increase in density may be achieved through an improvement in incubation, e.g. in incubation of the ALD process. As a result, the effect of preventing or reducing the likelihood of intermixing between the seed layer 45p and the preliminary main spacer 49p may be further enhanced.

Figure 13:
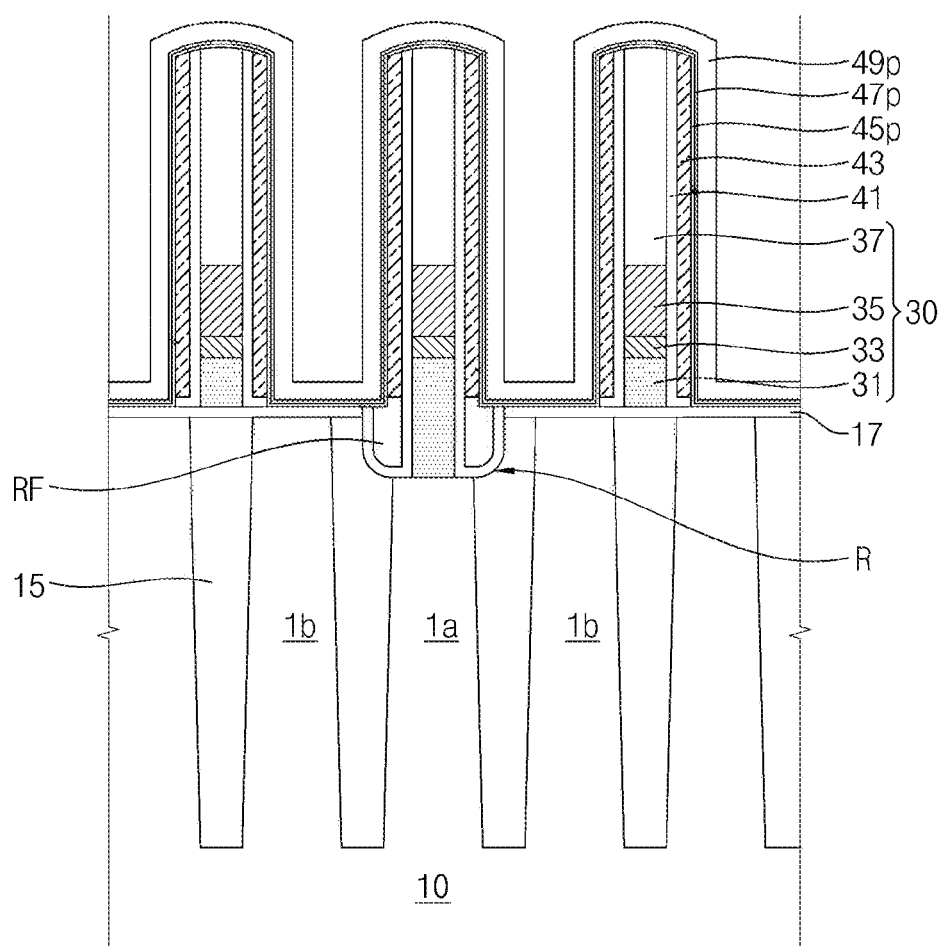

Referring to FIG. 13, the method may include forming the preliminary main spacer 49p on the protective layer 47p. The preliminary main spacer 49p may be formed to conformally cover an upper surface of the protective layer 47p. The preliminary main spacer 49p may be formed to have a thickness greater than either or both of the thickness of the inner spacer 41 and the thickness of the sacrificial spacer 43, or greater than a total thickness of the inner spacer 41 and the sacrificial spacer 43. The preliminary main spacer 49p may include, e.g. may consist of, the same material as the inner spacer 41. For example, the preliminary main spacer 49p may include SiN. The preliminary main spacer 49p may be formed through repeated execution of a second cycle including introduction of a silicon source material, purge, and introduction of a nitrogen source material. Since the preliminary main spacer 49p is formed on the protective layer 47p, it may be possible to prevent or reduce the likelihood of formation of a transition layer caused by intermixing between the seed layer 45p and the preliminary main spacer 49p and intermixing between the preliminary main spacer 49p and the sacrificial spacer 43. As a result, even when the thickness of the main spacer 49 is reduced in order to reduce the total thickness of the outer spacer OS, for reduction in size, e.g. for miniaturization or shrink of the resultant semiconductor device, it may be possible to avoid or reduce the likelihood of a phenomenon in which the outer spacer OS bursts or volcanoes due to a cleaning process (described later) for forming an air gap AG.

Detailed contents of the processes of forming the seed layer 45p, the protective layer 47p and the preliminary main spacer 49p described in conjunction with FIGS. 11 to 13 will be given later in conjunction with FIGS. 31 to 33.

Figure 14:
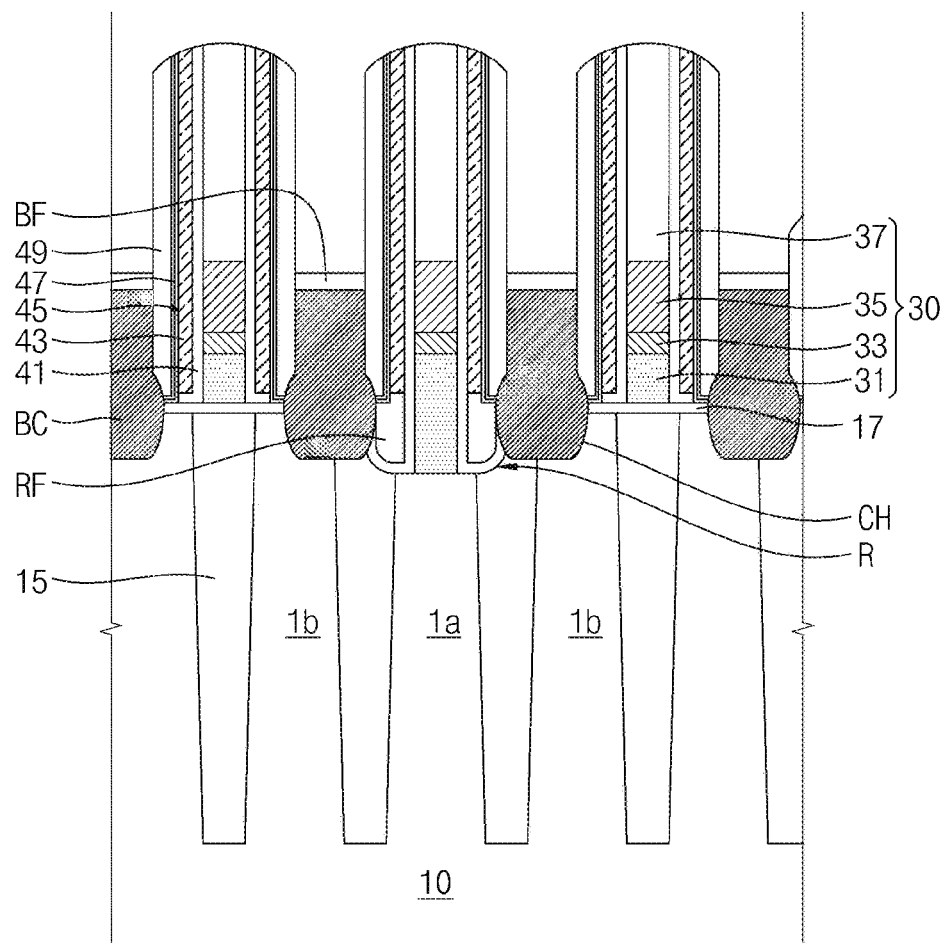

Referring to FIG. 14, the method may include forming a seed spacer 45, a protective spacer 47, and a main spacer 49 while forming a contact hole CH. The seed spacer 45 and the protective spacer 47 may be formed on a side wall of the sacrificial spacer 43, and the main spacer 49 may be formed on the protective spacer 47 through anisotropic etching of the seed layer 45p, the protective layer 47p and the preliminary main spacer 49p. Thereafter, the interlayer insulating layer 17 exposed between the main spacers 49 respectively disposed at opposite sides of the bit line structure 30 may be etched, e.g. etched with a wet and/or dry etching process, thereby exposing the substrate 10. An insulating film (not shown) may be formed on an exposed surface of the substrate 10, and may then be patterned, thereby forming a contact hole CH.

The method may include forming a storage node contact BC and a buffer layer BF. The storage node contact BC may be formed in the contact hole CH by forming a storage contact material layer over the entire surface of or at least the entire upper surface of the substrate 10, and then partially recessing the storage contact material layer through an etch-back process (e.g. a blanket etching process). The buffer layer BF may be formed on the storage node contact BC. The buffer layer BF may include a silicide layer.

Figure 15:
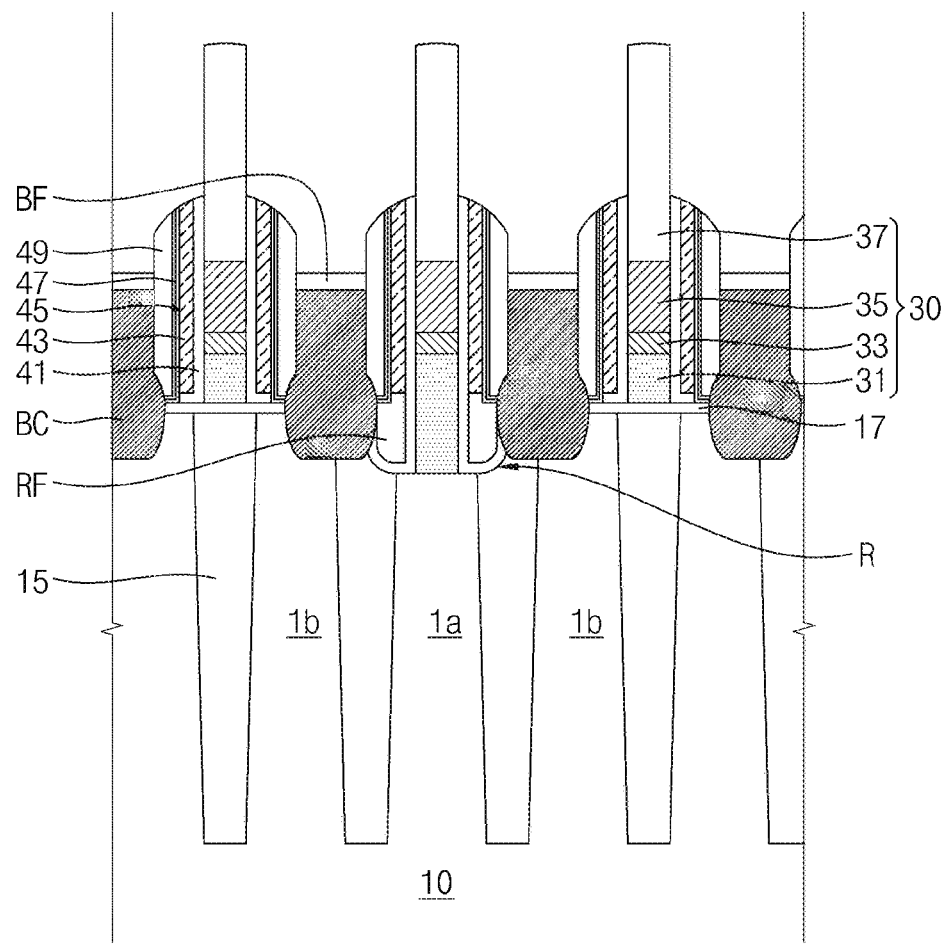

Referring to FIG. 15, the method may include anisotropically etching the bit line spacer 40, thereby removing an upper portion of the bit line spacer 40. For example, the method may include anisotropically etching the inner spacer 41, the sacrificial spacer 43, the seed spacer 45, the protective spacer 47 and the main spacer 49, thereby removing upper portions thereof. The levels of upper ends of, e.g. of upper ends of each of, the inner spacer 41, the sacrificial spacer 43, the seed spacer 45, the protective spacer 47, and the main spacer 49 may be lower than the level of the bit line capping layer 37. As a result, upper side walls of the bit line capping layer 37 may be exposed. The levels of upper ends of, e.g. of upper ends of each of, the inner spacer 41, the sacrificial spacer 43, the seed spacer 45, the protective spacer 47 and the main spacer 49 may be higher than the level of an upper surface of the buffer layer BF.

Figure 16:
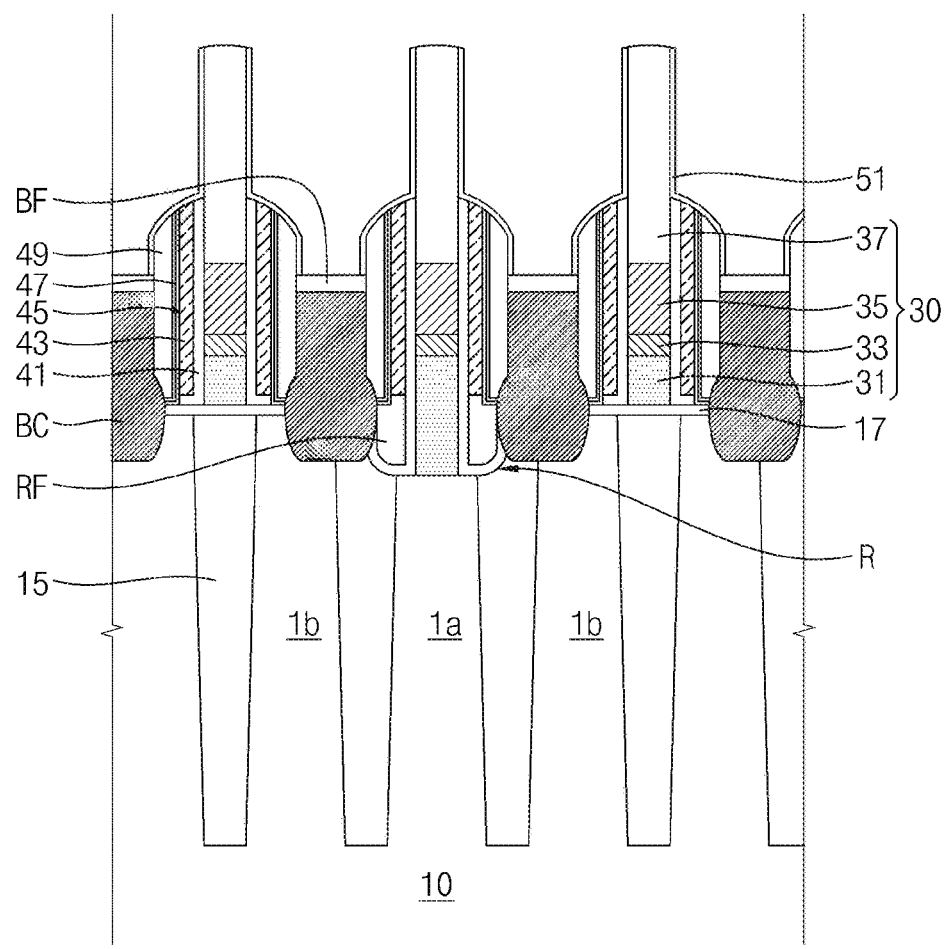

Referring to FIG. 16, the method may include forming a capping pattern 51. Formation of the capping pattern 51 may include forming a capping spacer material over the entire surface of or at least the entire upper surface of the substrate 10, and performing an etch-back process (e.g. a blanket etching process), thereby forming the capping pattern 51. The capping pattern 51 may cover exposed surfaces of upper ends of the inner spacer 41, the sacrificial spacer 43, the seed spacer 45, the protective spacer 47 and the main spacer 49. In addition, the capping pattern 51 may cover exposed side surfaces of the bit line capping layer 37. For example, the capping pattern 51 may include at least one of SiN and SiBN.

Figure 17:
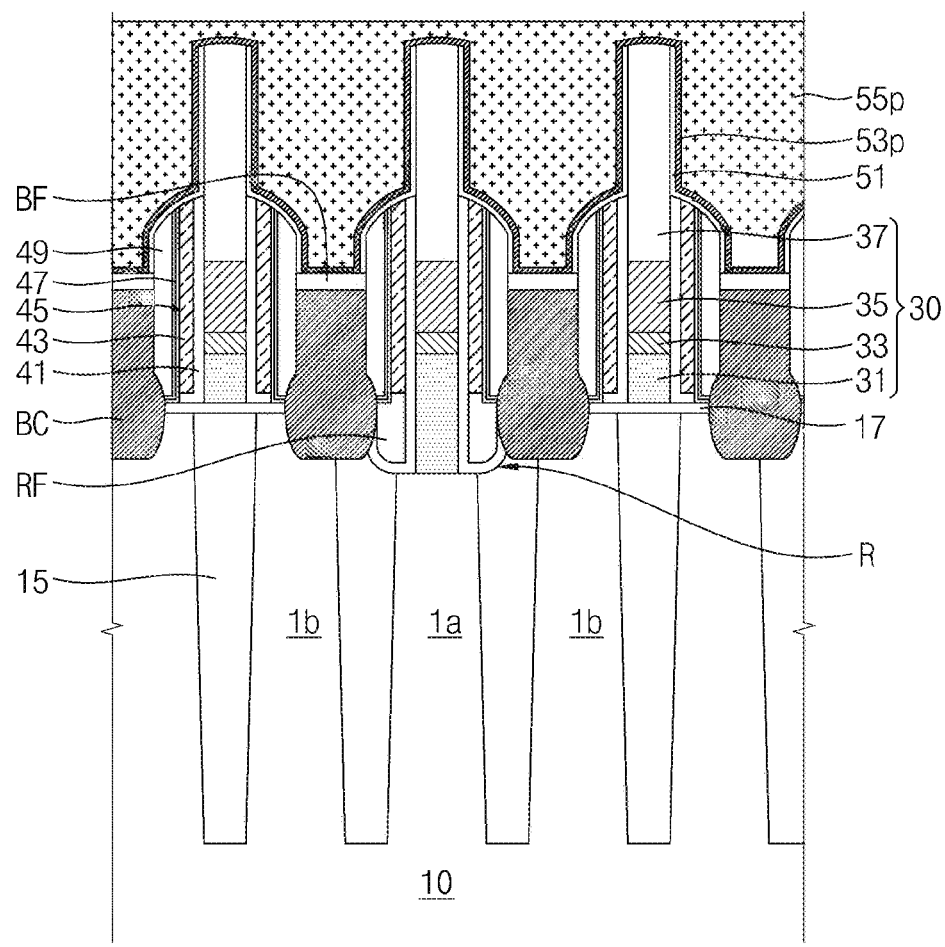

Referring to FIG. 17, the method may include forming a landing pad barrier material layer 53p and a landing pad material layer 55p. Formation of the landing pad barrier material layer 53p may include conformally forming a barrier metal such as titanium nitride (TiN) over the entire surface of the resultant structure. Formation of the landing pad material layer 55p may include forming a conductive material on the landing pad barrier material layer 53p to completely fill a space between adjacent ones of the bit line structures 30. For example, the landing pad material layer 55p may include a material such as tungsten (W).

Figure 18:
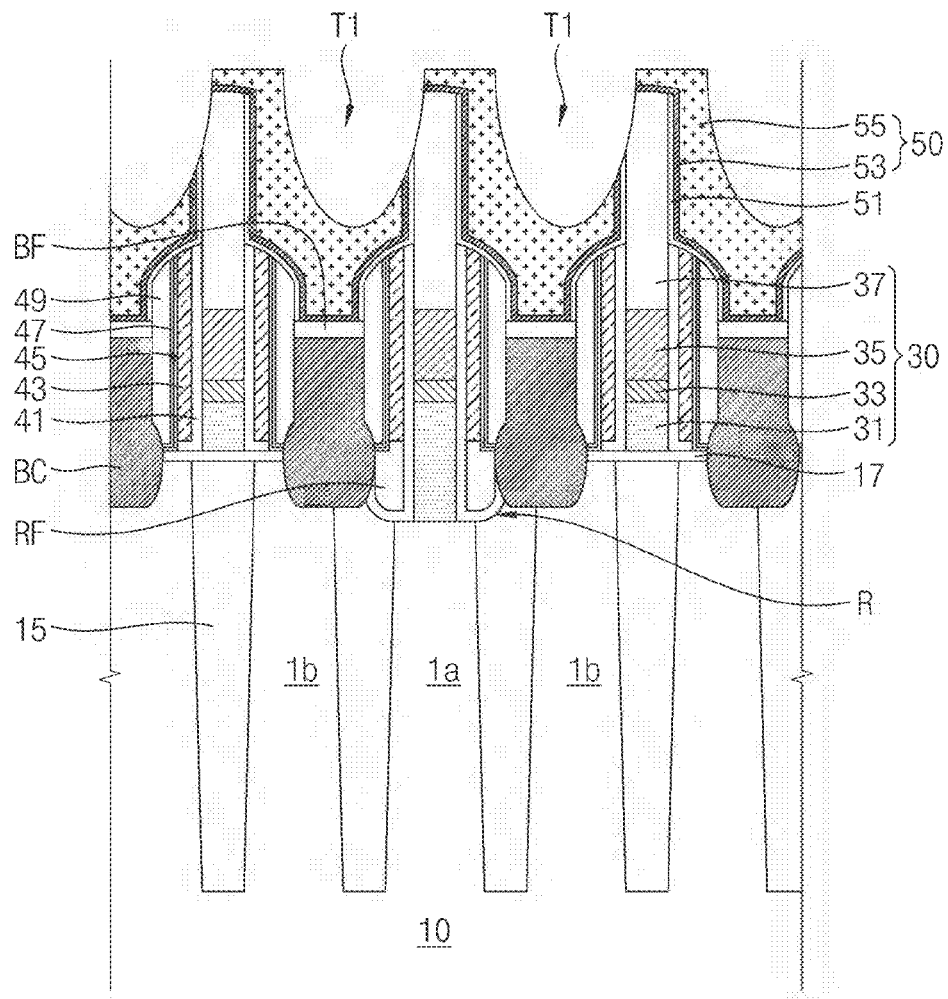

Referring to FIG. 18, the method may include forming first pad isolation trenches T1 through an anisotropic etching process such as a dry etching process. As the first pad isolation trenches T1 are formed, the landing pad barrier material layer 53p and the landing pad material layer 55p may be isolated from each other and, as such, landing pad structures 50 may be formed. Each landing pad structure 50 may include a landing pad barrier layer 53 and a landing pad 55. The landing pad structures 50 may be physically isolated from one another, and may be electrically insulated from one another. Referring to FIG. 1, each first pad isolation trench T1 may have the form of a trench defining a landing pad 55.

Figure 19:
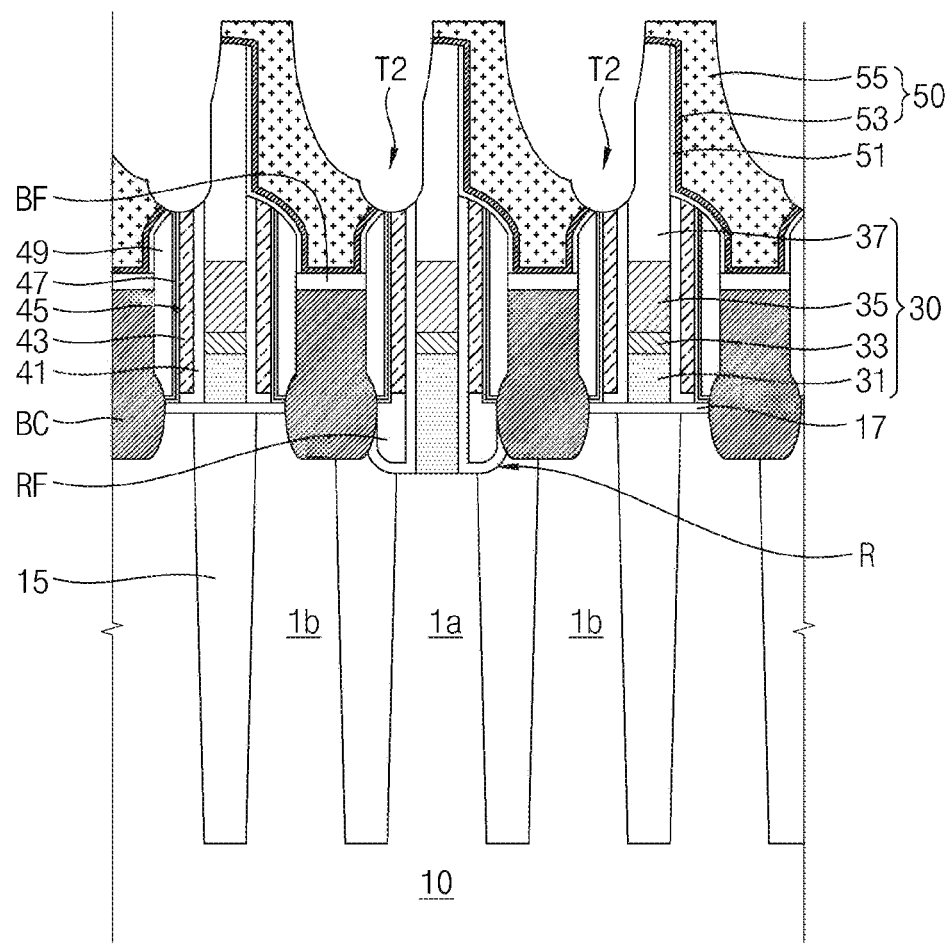

Referring to FIG. 19, the method may include forming second pad isolation trenches T2 through an anisotropic etching process such as a dry etching process using different, process parameters than the etching process used in forming the first pad isolation trenches T1. Each second pad isolation trench T2 may be formed as a portion of the landing pad structure 50 exposed through each first pad solation trench T1 is recessed to be concave. The upper ends of the inner spacer 41, the sacrificial spacer 43, the seed spacer 45, and the protective spacer 47 may be exposed through the corresponding second pad isolation trench T2. The anisotropic etching process for forming the second pad isolation trenches T2 may have higher anisotropic etching characteristics than the anisotropic etching process for forming the first pad isolation trenches T1, e.g. may include different process parameters.

Figure 20:
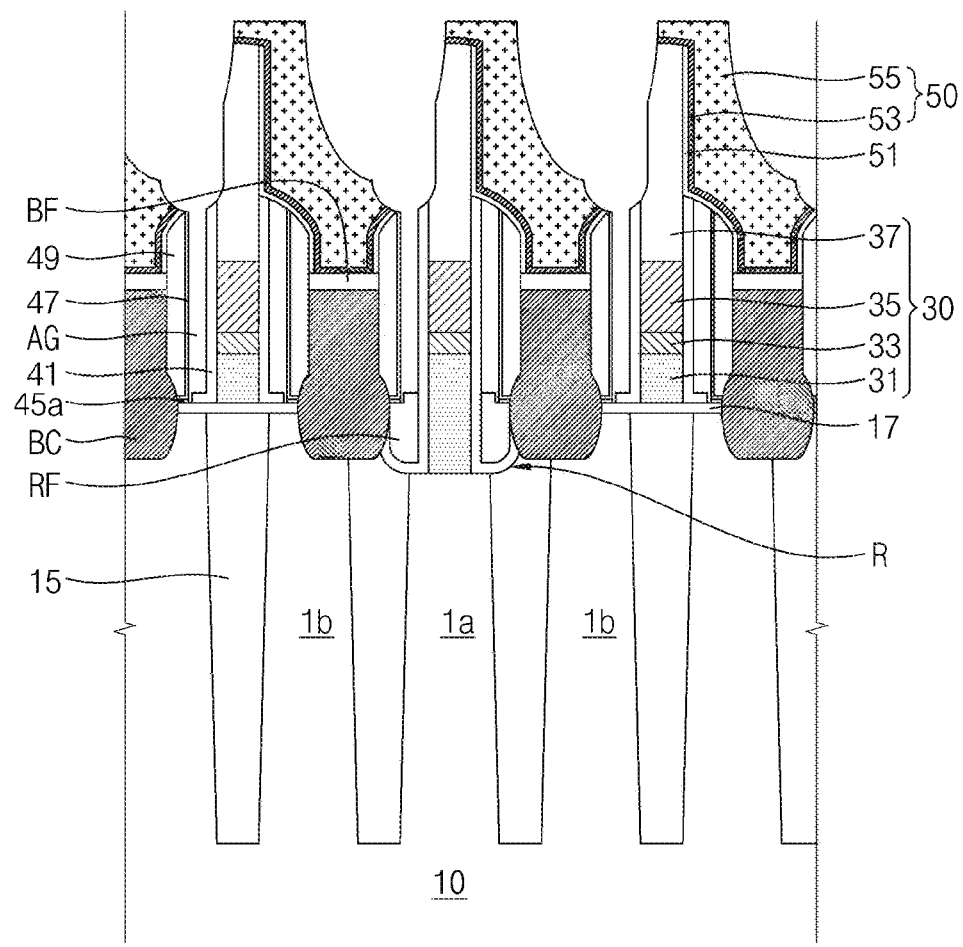

Referring to FIG. 20, the method may include removing the sacrificial spacer 43 and the seed spacer 45 through the corresponding second pad isolation trench T2, thereby forming an air gap AG. The air gap AG may be formed between the inner spacer 41 and the protective spacer 47 corresponding to the second pad isolation trench T2. The air gap AG may reduce parasitic capacitance between the corresponding bit line structure 30 and the corresponding storage node contact BC, thereby reducing resistive-capacitive delay of electrical signals. For example, the sacrificial spacer 43 and the seed spacer 45 may be etched by a cleaning process such as a wet cleaning process. The cleaning process may include use of an etchant such as buffered hydrogen fluoride and/or hot phosphoric acid and/or ammonia; however, example embodiments are not limited thereto. As the seed spacer 45 is removed together with the sacrificial spacer 43, the air gap AG may extend between the recess filler RF and the protective spacer 47. A portion of the seed spacer 45 disposed under the protective spacer 47 may remain without being removed by the cleaning process and, as such, a seed pattern 45a may be formed. As described above, the seed spacer 45 may achieve an increase in density through an improvement in incubation, and may secure an improved, e.g. a maximum, width of the air gap AG in accordance with subsequent removal thereof, thereby reducing, e g minimizing parasitic capacitance between the bit line structure 30 and the storage node contact BC.

Figure 21:
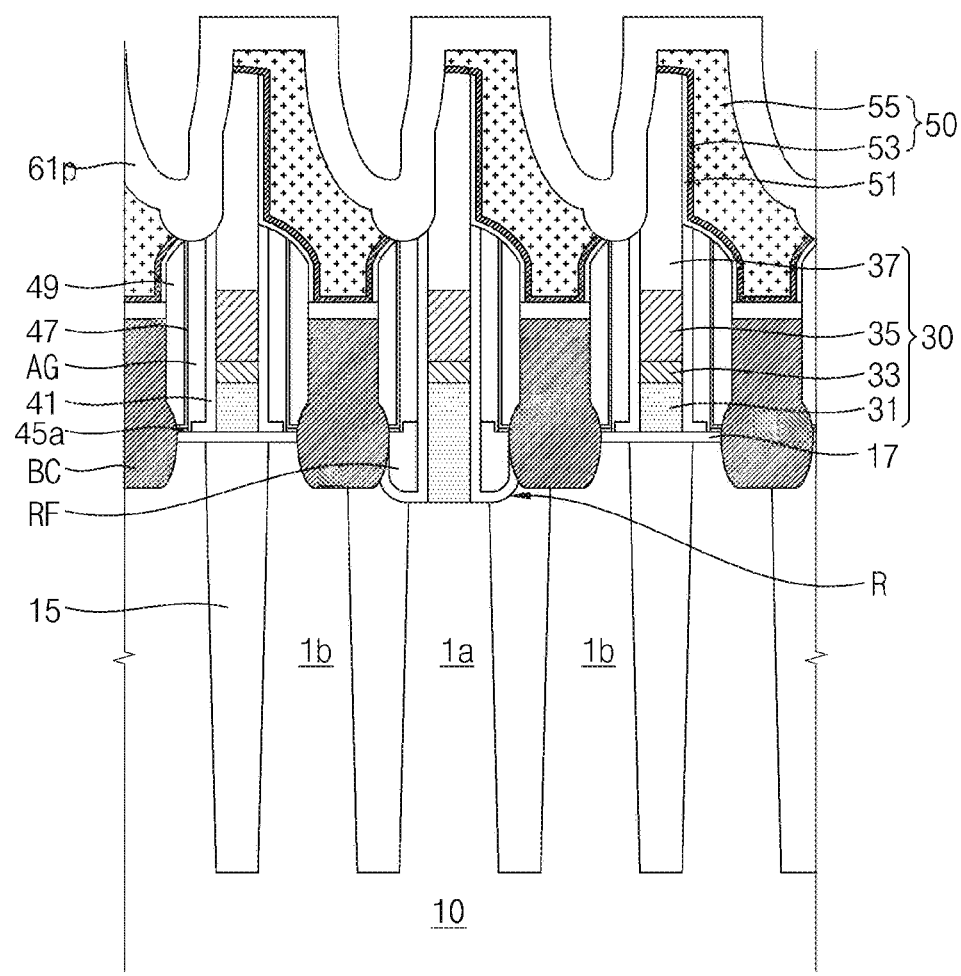

Referring to FIG. 21, the method may include forming a first pad isolation insulator 61p partially filling the first pad isolation trenches T1 and the second pad isolation trenches T2. The first pad isolation insulator 61p may seal an opening of the upper end of the air gap AG. The second pad isolation trenches T2 may be completely filled with the first pad isolation insulator 61p, whereas a residual space may partially remain in each first pad isolation trench T1. For example, the first pad isolation insulator 61p may include silicon carbonitride. At this time, the air gap AG may be sealed, and may be under vacuum and/or may have a gas, such as clean, dry air, therebetween.

Figure 22:
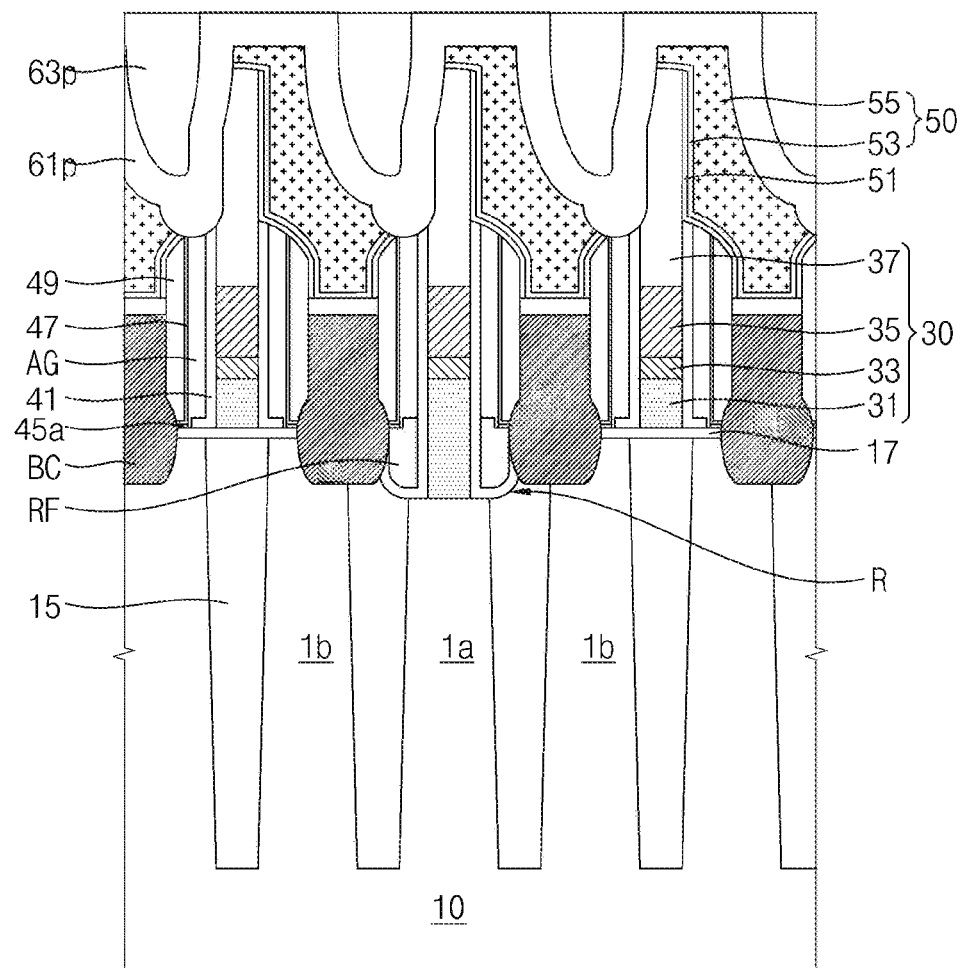

Referring to FIG. 22, the method may include forming a second pad isolation insulator 63p on the first pad isolation insulator 61p. The second pad isolation insulator 63p may completely fill the residual space of each first pad isolation trench T1. The second pad isolation insulator 63p may include silicon nitride. The second pad isolation insulator 63p may include the same, or different, material than that of the first pad isolation insulator 61p.

Again referring to FIG. 2A, after formation of the first pad isolation insulator 61p and the second pad isolation insulator 63p, a planarization process such as a chemical mechanical polishing (CMP) process and/or an etch-back process may be performed to expose an upper surface of each landing pad 55. In accordance with the planarization process, upper portions of the first pad isolation insulator 61p and the second pad isolation insulator 63p may be removed and, as such, a first pad isolation insulating layer 61 and a second pad isolation insulating layer 63 may be formed.

Figure 23:
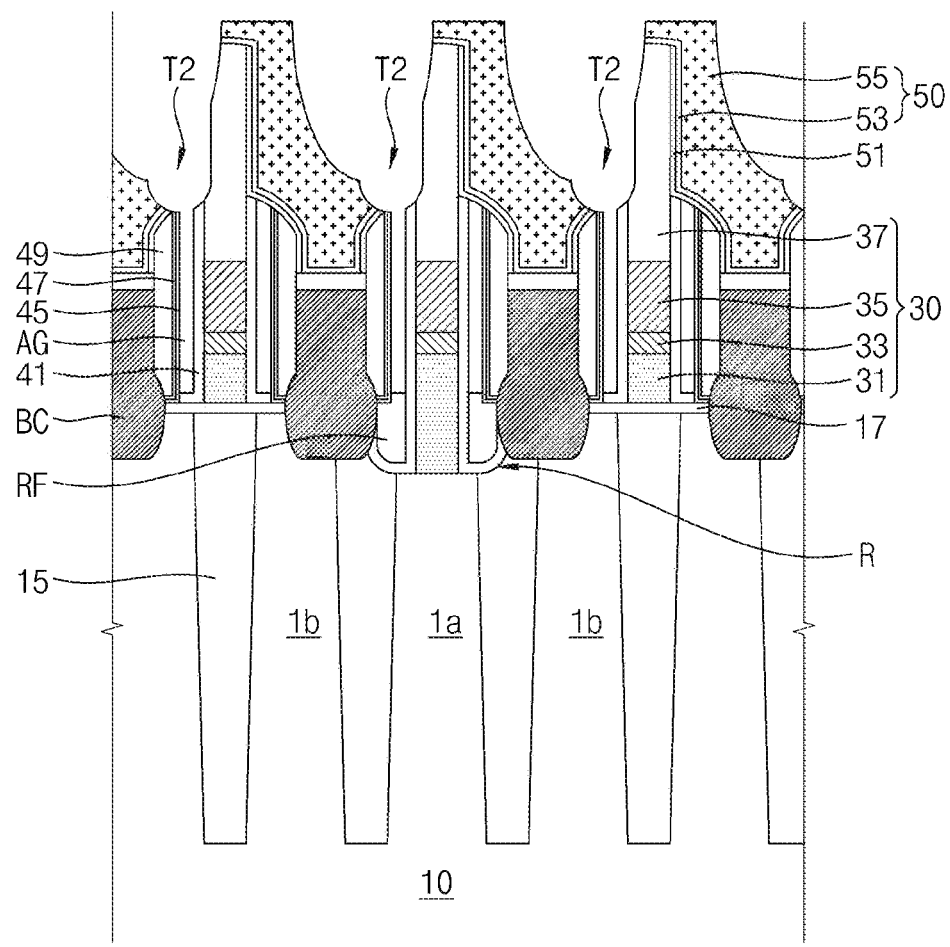
FIG. 23 illustrates a sectional view explaining a method for forming a semiconductor device in accordance with some example embodiments of inventive concepts.

FIG. 23 is a sectional view explaining a method for forming a semiconductor device in accordance with some example embodiments of inventive concepts.

First, referring to FIGS. 11 and 12, in some example embodiments, in the method, a seed layer 45p may be formed using a silicon thin film including carbon, including carbon and nitrogen, or including boron and nitrogen, differently from the above-described embodiment. For example, the seed layer 45p may be or include SiC, SiCN, or SiBN. In addition, a protective layer 47p be formed to include any one of SiC, SiCN and SiBN under the condition that the material of the protective layer 47p is different from that of the seed layer 45p. Although only the seed layer 45p and the protective layer 47p are shown in FIG. 12, a thin film may be additionally formed on the protective layer 47 in some example embodiments. For example, the additionally-formed thin film may include any or at least one of SiC, SiCN and SiBN under the condition that the material of the thin film is different from that of the protective layer 47p. The material of the thin film may be identical to or different from that of the seed layer 45p.

Thereafter, the same processes as the processes described in conjunction with FIGS. 13 to 19 may be performed. Subsequently, referring to FIG. 23, the method may include removing a sacrificial spacer 43 through each second pad isolation trench T2, thereby forming an air gap AG. The air gap AG may be formed between an inner spacer 41 and a seed spacer 45. Since the seed spacer 45 includes a material having an etch selectivity with respect to the sacrificial spacer 43, the seed spacer 45 may not be removed during formation of the air gap AG. Both the seed spacer 45 and the protective spacer 47 may function to protect a main spacer 49 from a cleaning material of a cleaning process for removing the sacrificial spacer 43. Since the main spacer 49 is protected or at least partially protected by the seed spacer 45 and the protective spacer 47, as described above, a burst phenomenon of the main spacer 49 may be prevented or reduced in likelihood of occurrence even when the thickness of the main spacer 49 is reduced. There may be a reduction in likelihood of pin hole formation. Accordingly, through a reduction in the total thickness of an outer spacer OS, it may be possible to further increase the width of the air gap AG and to reduce parasitic capacitance between a bit line structure 30 and a storage node contact BC.

FIGS. 24 to 30 are sectional views explaining a method for forming a semiconductor device in accordance with some example embodiments of inventive concepts.

Figure 24:
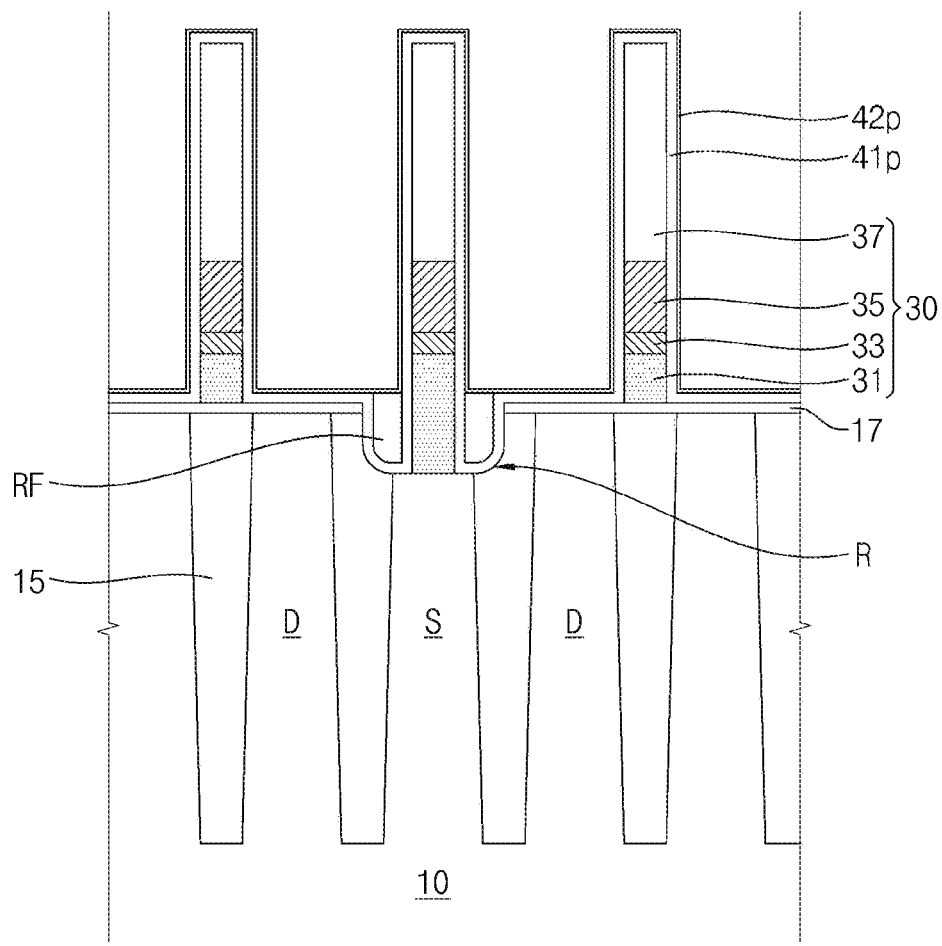
FIGS. 24 to 30 illustrate sectional views explaining a method for forming a semiconductor device in accordance with some example embodiments of inventive concepts.

Referring to FIG. 24, the method may further include forming a capping layer 42p after formation of a preliminary inner spacer 41p and a recess filler RF as in FIG. 8. The capping layer 42p may be formed to cover, e.g. conformally cover a surface of the preliminary inner spacer 41p and a surface of the recess filler RF. The thickness of the capping layer 42p may be smaller than the thickness of the inner spacer 41. For example, the capping layer 42p may include SiCN. The method of forming the capping layer 42p may be the same as the method of forming the protective layer 47p, as described in conjunction with FIG. 12. For example, the capping layer 42p may be formed in the form of a thin film through an ALD process, using at least one of a silicon source material, a nitrogen source material, a carbon source material and/or a boron source material. The capping layer 42p may be formed to have a thickness of about 1 to 20 Å (0.1 nm to 2 nm). The capping layer 42p may prevent or reduce the likelihood of intermixing between a preliminary sacrificial spacer 43p and an inner spacer 41 which will be subsequently formed.

Figure 25:
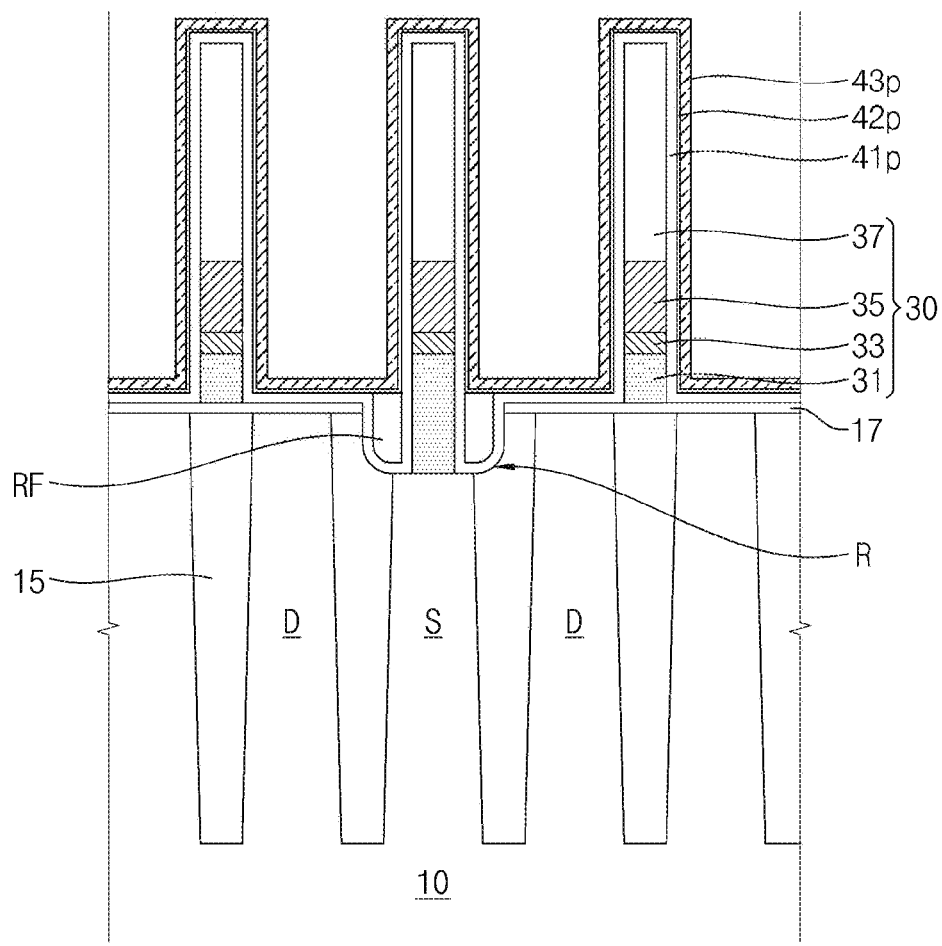

Referring to FIG. 25, the method may include forming the preliminary sacrificial spacer 43p on the capping layer 42p. The preliminary sacrificial spacer 43p may be formed to cover, e.g. conformally cover a surface of the capping layer 42p. The preliminary sacrificial spacer 43p may be formed to have a thickness substantially equal to or slightly greater than the thickness of the preliminary inner spacer 41p. For example, the preliminary sacrificial spacer 43p may include silicon oxide.

Figure 26:
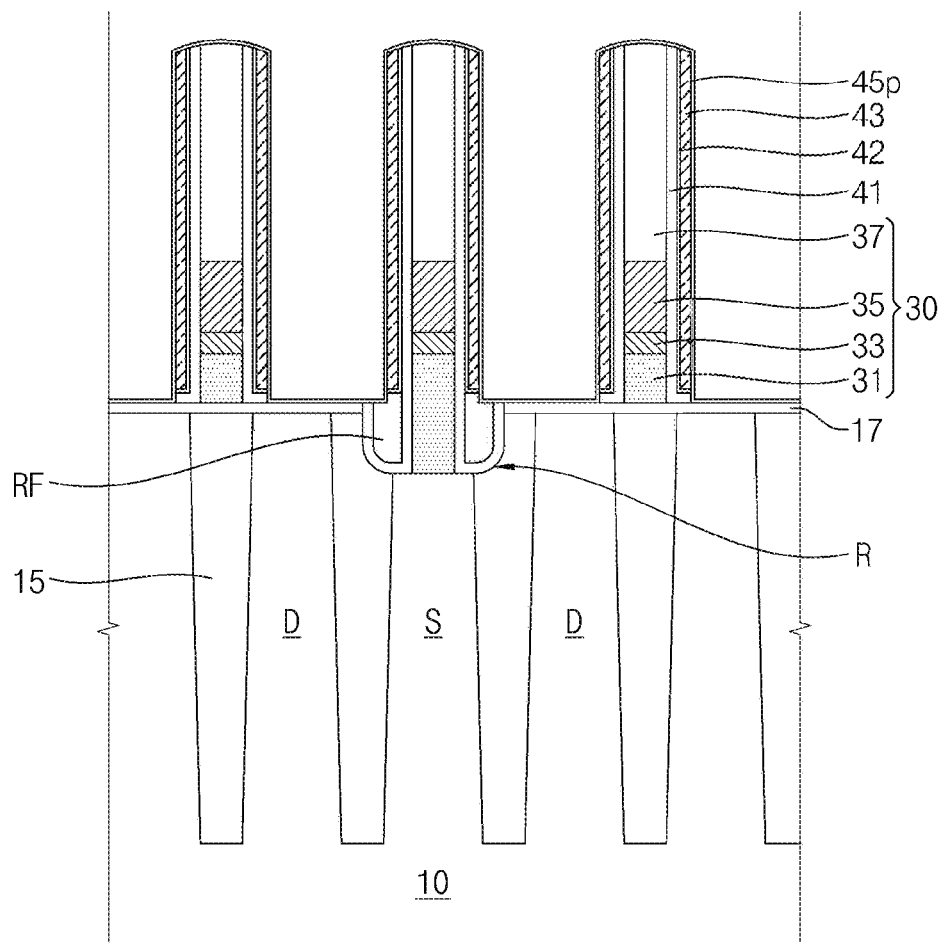

Referring to FIG. 26, the method may include forming a capping spacer 42 and a sacrificial spacer 43. The capping spacer 42 and the sacrificial spacer 43 may be formed through anisotropic etching of the capping layer 42p and the sacrificial spacer 43.

The method may include forming a seed layer 45p on the sacrificial spacer 43. The seed layer 45p may cover an upper surface of an interlayer insulating layer 17 and a surface of the sacrificial spacer 43. In addition, the seed layer 45p may cover, e.g. conformally cover opposite ends of the inner spacer 41, opposite ends of the capping layer 42p, and an upper surface of the capping layer 42p.

Figure 27:
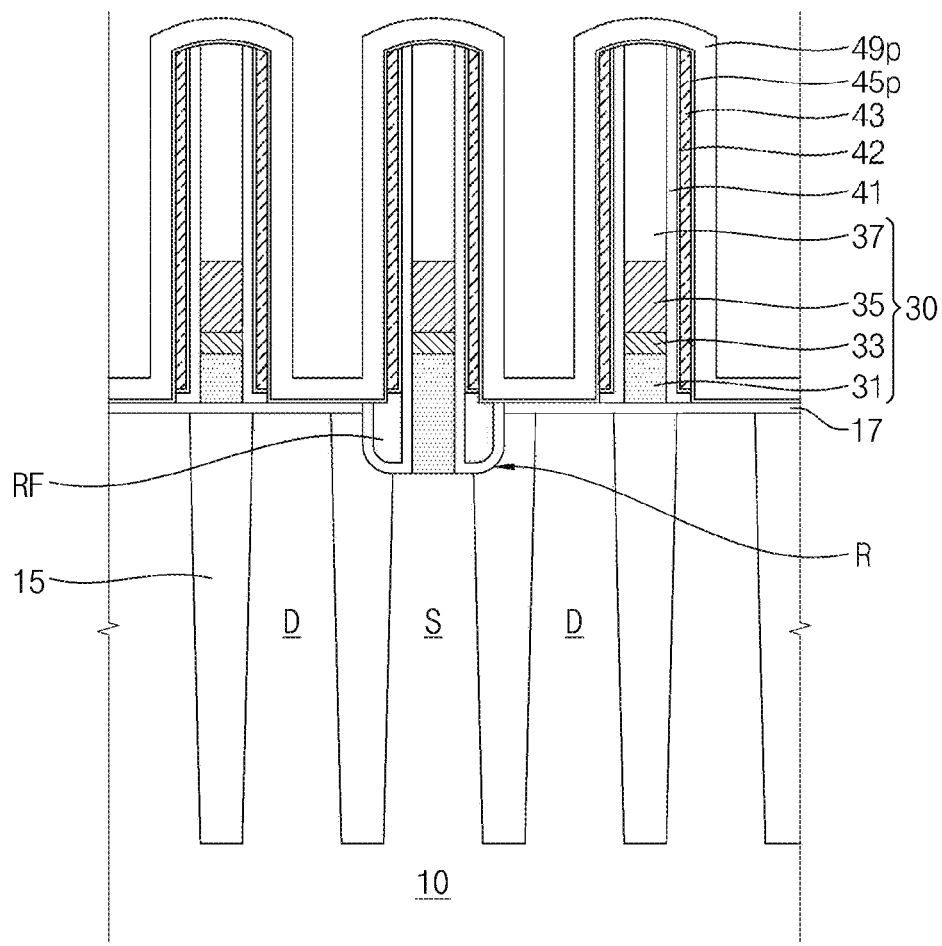

Referring to FIG. 27, the method may include forming a preliminary main spacer 49p on the capping layer 42p. The preliminary main spacer 49p may cover, e.g. conformally cover a surface of the capping layer 42p. The preliminary main spacer 49p may be formed to have a thickness greater than the thickness of the inner spacer 41 and the thickness of the sacrificial spacer 43. For example, the preliminary main spacer 49p may include silicon nitride. The preliminary main spacer 49p may include, e.g. may consist of the same material as the inner spacer 41.

Figure 28:
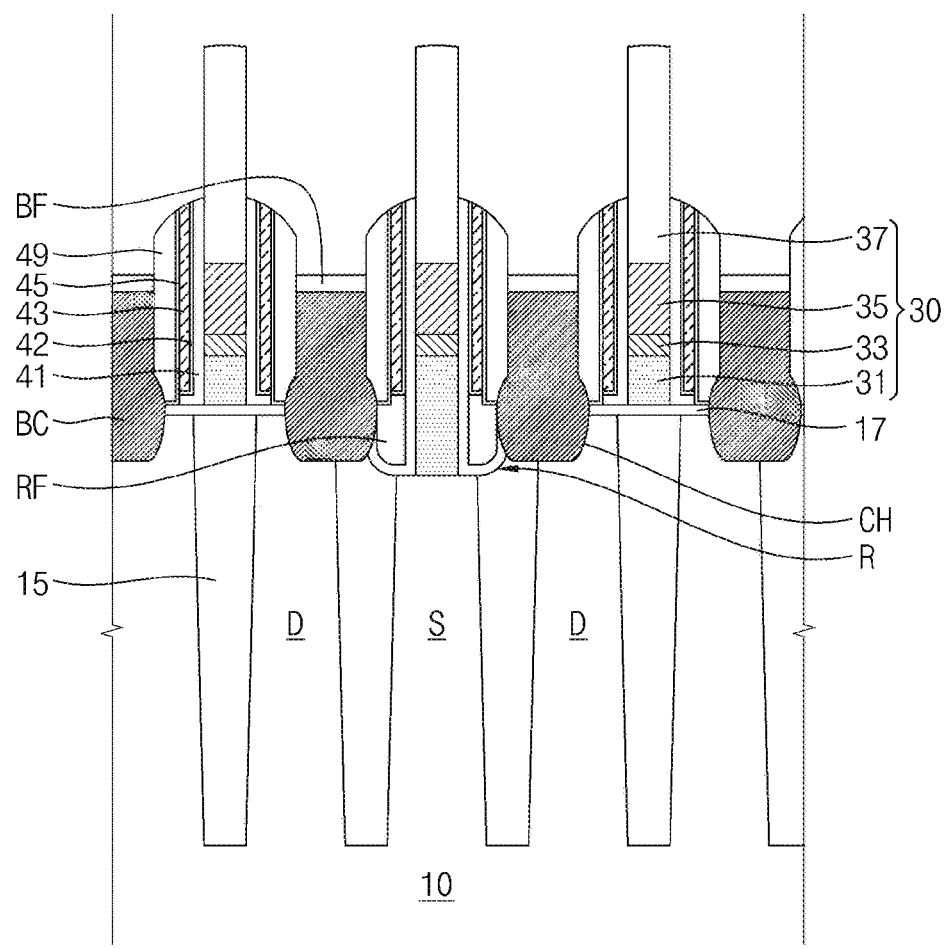

Referring to FIG. 28, the method may include forming a seed spacer 45 and a main spacer 49 while forming a contact hole CH. The seed spacer 45 and the main spacer 49 may be formed on each side wall of the sacrificial spacer 43 through anisotropic etching of the seed layer 45p and the preliminary main spacer 49p. Thereafter, the interlayer insulating layer 17 exposed between the main spacer 49 may be etched, thereby exposing a substrate 10. Formation of the contact hole CH may be achieved by forming an insulating film (not shown) on an exposed surface of the substrate 10, and patterning the insulating film. Thereafter, the method may include forming a storage node contact BC and a buffer layer BF, as described in conjunction with FIG. 14. Subsequently, the method may include anisotropically etching a bit line spacer 40, thereby removing an upper portion of the bit line spacer 40.

Figure 29:
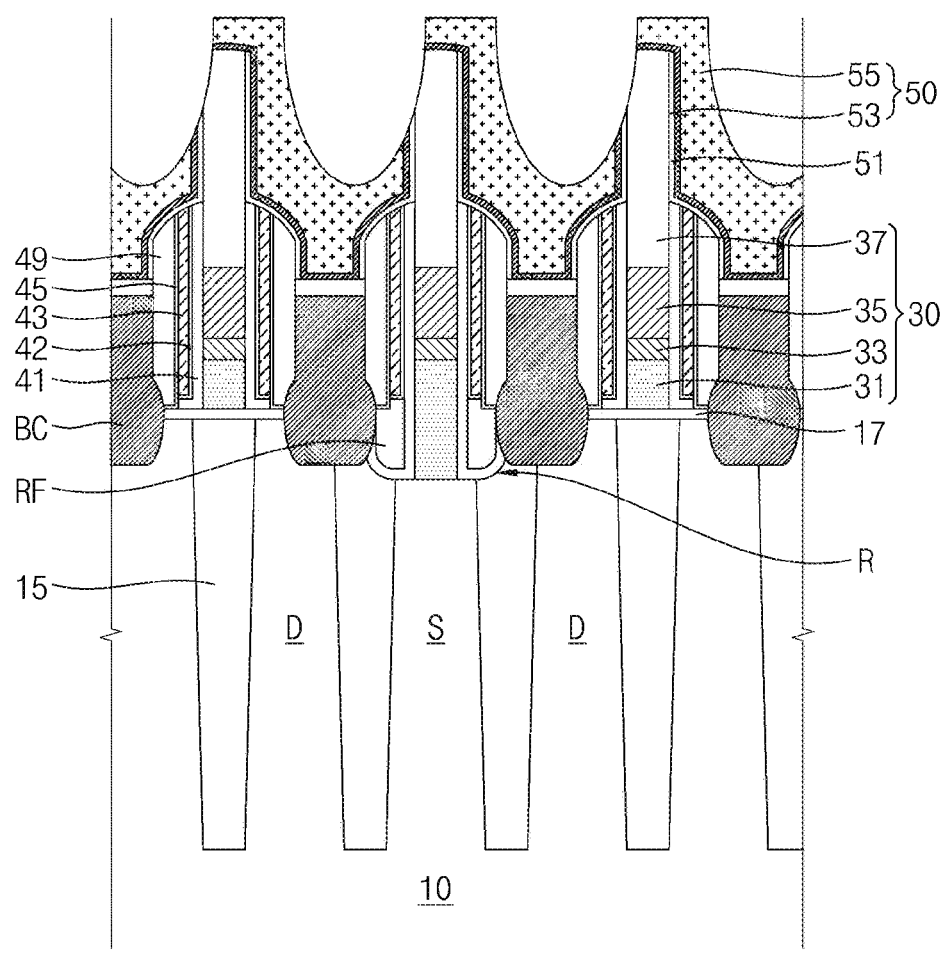
Figure 30:
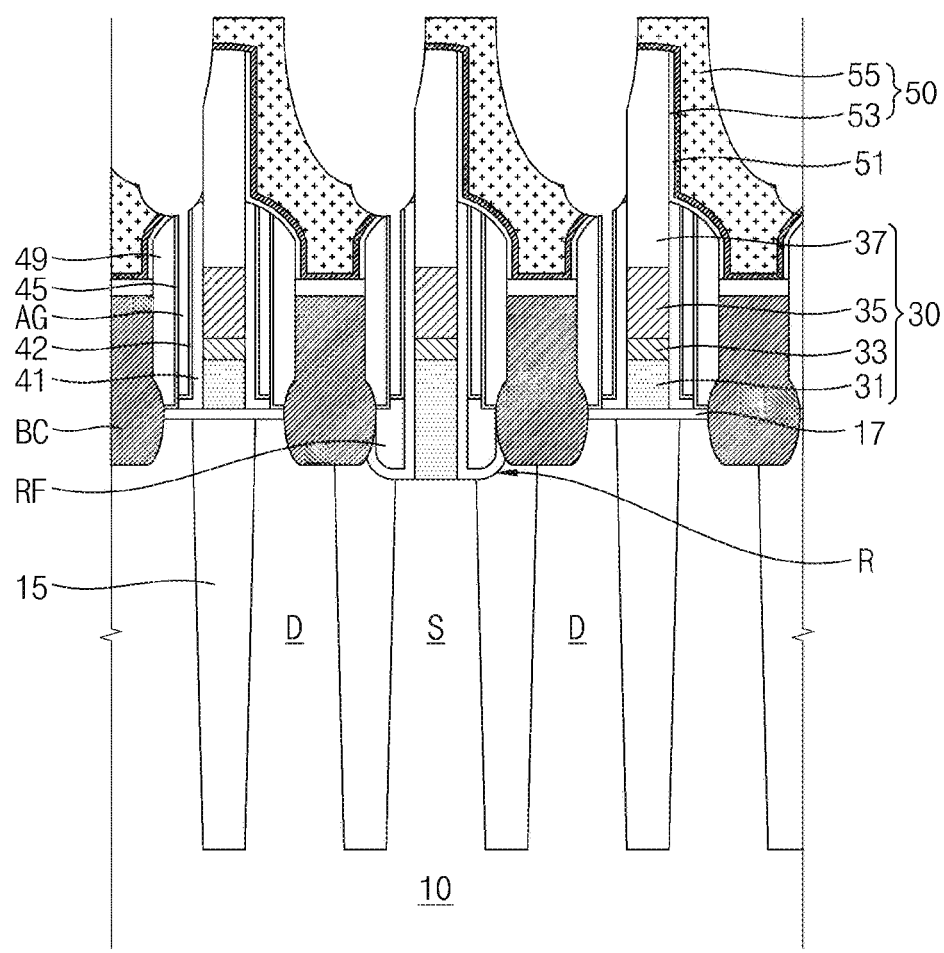

Referring to FIGS. 29 and 30, the method may include forming a first pad isolation trench T1 and forming a second pad isolation trench T2. Thereafter, the method may include removing the sacrificial spacer 43 through the second pad isolation trench T2, and forming an air gap AG. The air gap AG may be formed between the capping spacer 42 and the seed spacer 45. For example, the sacrificial spacer 43 may be etched by a cleaning process.

Again referring to FIG. 4, subsequently, the method may include forming a first pad isolation insulating layer 61 and a second pad isolation insulating layer 62 filling the first pad isolation trench T1 and the second pad isolation trench T2.

Figure 31:
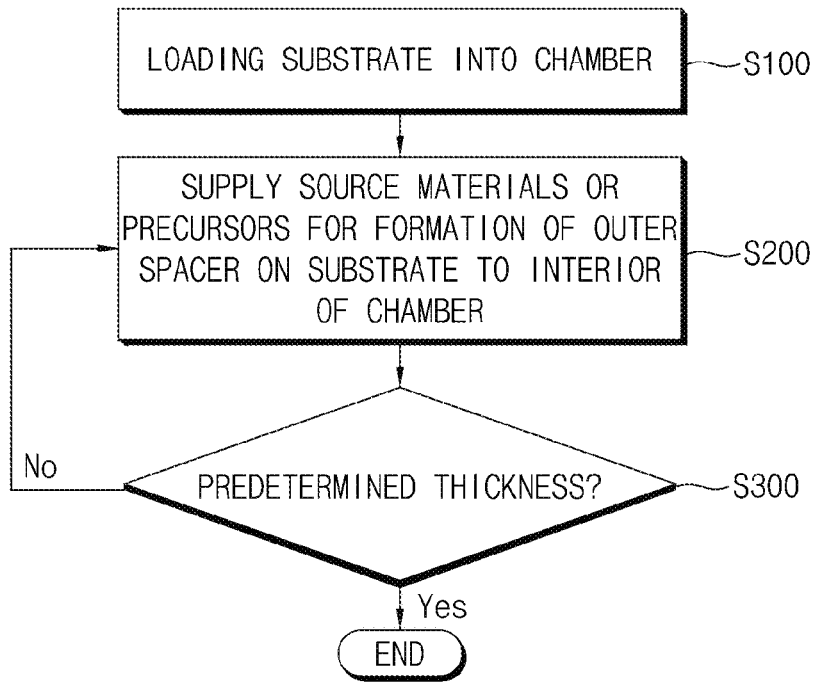
FIG. 31 illustrates a flowchart explaining a method for forming an outer spacer in accordance with some example embodiments of inventive concepts.

FIG. 31 is a flowchart explaining a method for forming an outer spacer in accordance with some example embodiments of inventive concepts.

Referring to FIG. 31, a substrate is loaded into a reaction space such as a chamber (S100), and source materials or precursors may be supplied to an interior of the reaction space in order to form an outer spacer on the substrate (S200). The source materials or precursors may be supplied through a shower-head (not shown); however, example embodiments are not limited thereto. When an outer spacer having a desired thickness is formed, the substrate may be unloaded from the chamber (S300). The thickness of the outer spacer may be measured in-situ within the chamber; however, example embodiments are not limited thereto.

The method of forming the outer spacer on the substrate in operation S200 may be carried out or performed using any method known to a person of ordinary skill in the art. In some example embodiments, the method of forming the outer spacer may be carried out through atomic layer deposition (ALD). In particular, a method of forming a low-k dielectric film may be carried out through plasma enhanced ALD (PEALD). However, inventive concepts are not limited to such methods. The following description will be given in conjunction with the case in which the outer spacer is formed on the substrate through PEALD.

Figure 32:
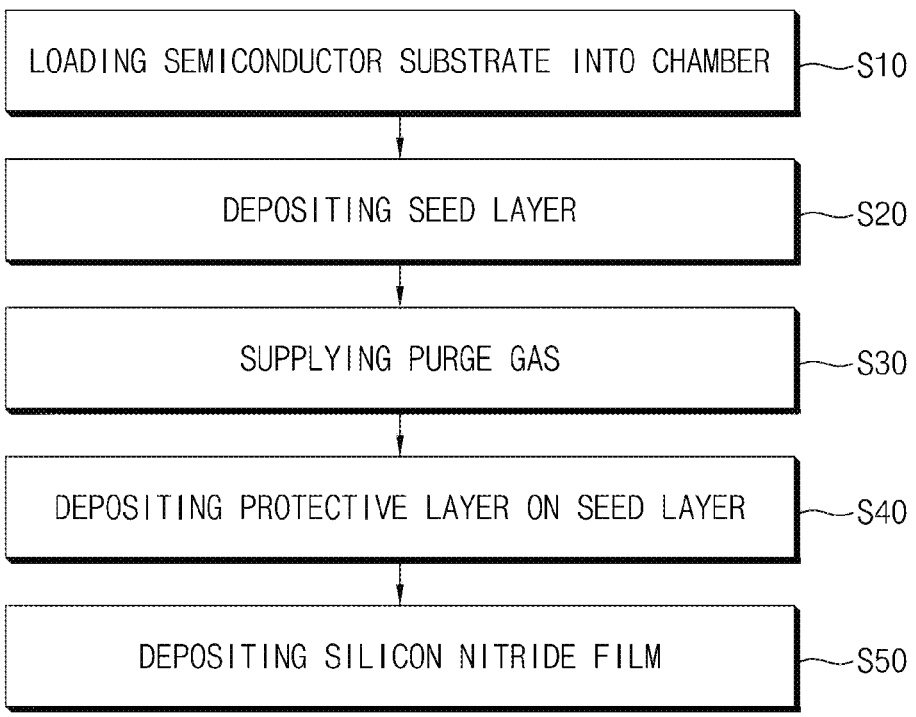
FIG. 32 illustrates a process flowchart explaining a method for forming a seed layer, a protective layer and a preliminary main spacer for formation of an outer spacer in accordance with some example embodiments of inventive concepts.
Figure 33:
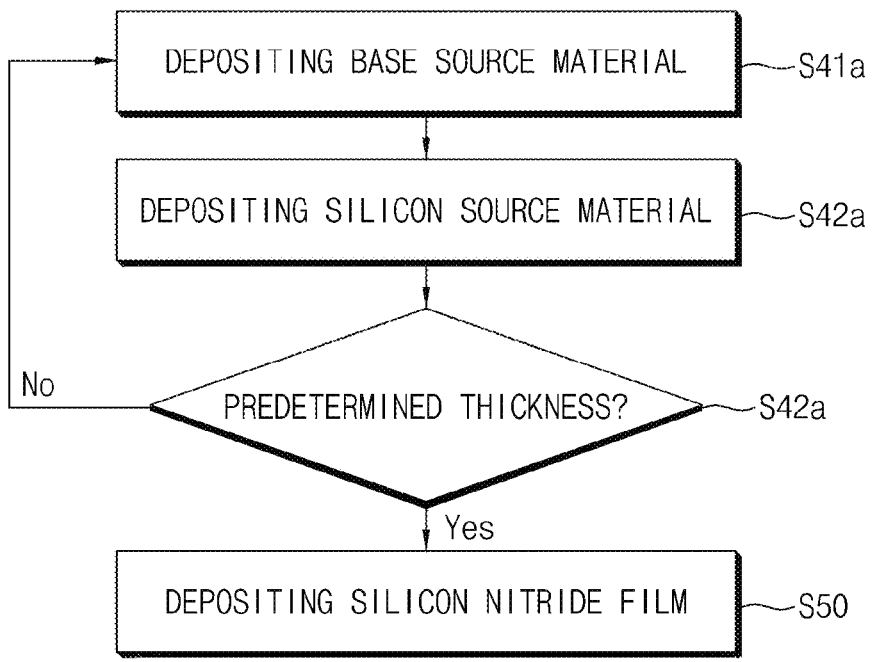
FIGS. 33 and 34 illustrate process flowcharts explaining a method for forming a protective layer of FIG. 32.
Figure 34:
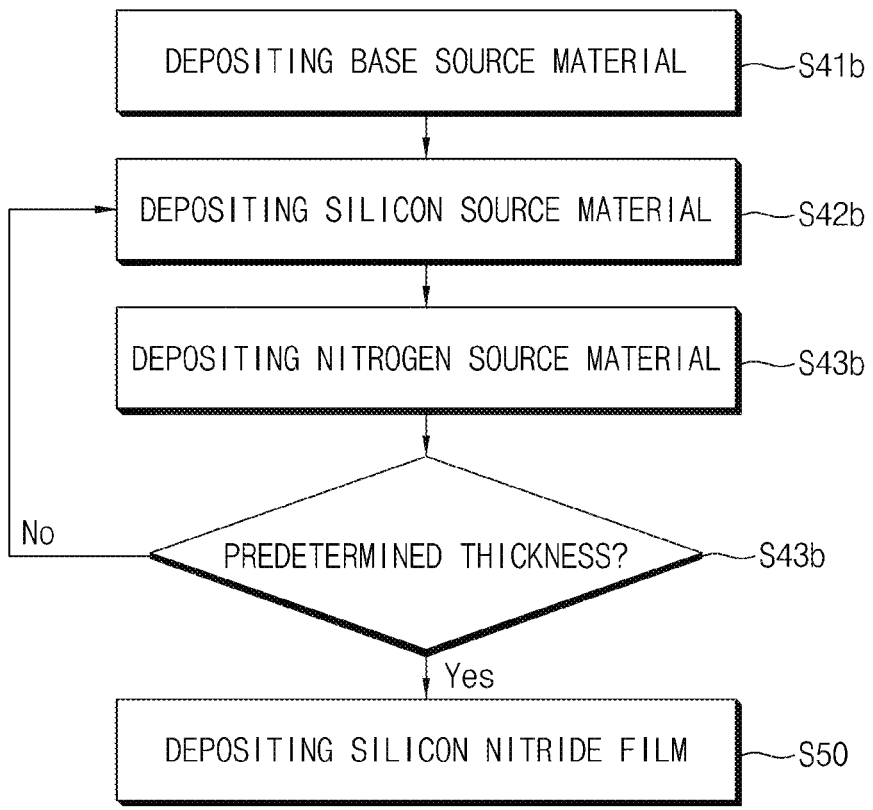

FIG. 32 is a process flowchart explaining a method for forming a seed layer, a protective layer, and a preliminary main spacer for formation of an outer spacer in accordance with some example embodiments of inventive concepts. FIGS. 33 and 34 are process flowcharts explaining a method for forming a protective layer of FIG. 32.

Referring to FIG. 32, the method may include loading a semiconductor substrate into a chamber of semiconductor equipment (S10) such as a tool used in PEALD, depositing a seed layer (S20), supplying a purge gas (S30), depositing a protective layer on the seed layer (S40), and depositing a silicon nitride film (S50). The operations may be carried out in the same semiconductor equipment without vacuum interruption; e.g. the chamber may be under vacuum throughout the operations such as S20-S50.

The method may include loading a semiconductor substrate into a chamber of semiconductor equipment (S10). The semiconductor substrate, which is loaded into the chamber, may include structures and/or configurations such as a bit line structure 30, an inner spacer 41 and a sacrificial spacer 43 formed through processes of FIGS. 6 to 10. For example, the prepared semiconductor substrate may be or include product formed with a sacrificial spacer 45 which is a silicon oxide film. The silicon oxide film may be on an upper surface of the substrate 10.

The method may include forming a seed layer ("45p" in FIG. 11) through execution of a seed layer deposition process for the prepared semiconductor substrate (S20). The seed layer deposition process may be or correspond to a deposition process using a silicon source material, and may be performed at a temperature of about 600 to 700° C. The silicon source material may or include be a halogen-substituted silane-based silicon precursor such as at least one of hexachlorodisilane (HCD), dichlorosilane (DCS), disilane (DS), trichlorosilane (TCS: $SiCl_3H$), etc. Alternatively, the silicon source material may be or include a silane-based silicon source material not including carbon or nitrogen, as expressed by the following Chemical Formula 1:

$$Si_nH_{2(N-1)+4}$$ [Chemical Formula 1]

The method may include performing a process for supplying a purge gas to the seed layer ("45p" in FIG. 11) when a film formed through a silicon deposition process has a specific (or, alternatively, predetermined) thickness (S30). In some example embodiments, the purge gas may be hydrogen gas, e.g. H2. For example, when hexachlorodisilane (HCD) is supplied as a silicon source material in operation S20, a chemical bond of two silicon atoms of the hexachlorodisilane (HCD) may be dissociated and, as such, the silicon atoms may be bonded to a substrate. For example, two —$SiCl_3$ bonds may be formed on the substrate. A chloro group has a large size and, as such, may interfere with adsorption of other molecules, for example, a carbon source, which is subsequently suppled, on to the substrate or reaction of the carbon source with silicon due to steric hindrance thereof. Accordingly, when hydrogen gas is supplied immediately after supply of a silicon source, hydrogen may substitute for chloro groups. As a result, the size of atoms bonded to a silane group may be reduced and, as such, steric hindrance may be reduced in size or minimized, and a carbon source material, which is subsequently supplied, may more smoothly react with silicon atoms. For example, by the above-described purge process, an enhancement in incubation may be achieved during subsequent deposition of a protective layer 47p, and an increase in density of the seed layer ("45p" in FIG. 11) and the protective layer 47p may be achieved.

Subsequently, the method may include depositing the protective layer 47p on the seed layer 45p (S40). Referring to FIG. 33, the protective layer deposition process may include a single cycle of depositing a base source material (S41a) and depositing a silicon source material (S42a) in a sequential manner. The cycle may be repeated until the protective layer 47p is formed to a desired thickness. Referring to FIG. 34, the protective layer deposition process may further include depositing a silicon source material (S42b), and subsequently depositing a nitrogen source material (S43b). For example, the protective layer deposition process may include a single cycle of depositing a base source material (S41b), depositing a silicon source material (S42b) and depositing a nitrogen source material (S43b) in a sequential manner. In this case, the cycle may also be repeated until the protective layer is formed to a desired thickness.

The base source material may include a carbon source material and/or a boron source material. For example, the carbon source material may be or include an organic material such as $C_2H_4$. The boron source material may be or include a halogen-substituted borane-based boron precursor such as diborane ($B_2H_6$).

In some example embodiments, when the protective layer 47p is SiC, a cycle of supplying a carbon source material to the seed layer 45p and supplying a silicon source material to the seed layer 45p may be repeated to form the protective layer 47p. The cycle may be repeated until the formed film has a specific (or, alternatively, predetermined) thickness.

In some example embodiments, when the protective layer 47p is SiCN, a cycle of supplying a carbon source material to the seed layer 45p, supplying a nitrogen source material and supplying a silicon source material to the seed layer 45p may be repeated to form the protective layer 47p.

In some example embodiments, when the protective layer 47p is SiBN, a cycle of supplying a boron source material to the seed layer 45p, supplying a nitrogen source material and supplying a silicon source material to the seed layer 45p may be repeated to form the protective layer 47p.

Subsequently, the method may include depositing, on the protective layer 47p, a preliminary main spacer ("49p" in FIG. 13) which is a silicon nitride film (S50). Deposition of the silicon nitride film may be achieved through repetition of a cycle including supplying a silicon source material to the protective layer 47p and supplying a nitride source material to the protective layer 47p.

In accordance with some example embodiments of inventive concepts, intermixing between a sacrificial spacer, which is an oxide, and a main spacer, which is a nitride, may be prevented or reduced in likelihood of occurrence by a seed layer and a protective layer and, as such, formation of a transition layer may be prevented or reduced in likelihood of occurrence. Accordingly, it may be possible to form an air gap without occurrence, or with reduced likelihood of occurrence, of a burst phenomenon thereof while minimizing the thickness of the main spacer. Alternatively or additionally, the seed layer is removed together with a sacrificial spacer and, as such, a large or maximum air gap margin may be secured. Accordingly, parasitic capacitance between a bit line and a storage node contact may be reduced or minimized.

While the embodiments of inventive concepts have been described with reference to the accompanying drawings, it should be understood by those of ordinary skill in the art that various transitions may be made without departing from the scope of inventive concepts and without changing essential features thereof. Therefore, the above-described embodiments should be considered in a descriptive sense only and not for purposes of limitation.

What is claimed is:

1. A method for manufacturing a semiconductor device, comprising:
   loading a semiconductor substrate including a silicon oxide film into a chamber;
   depositing a seed layer on the silicon oxide film by supplying a first silicon source material;
   supplying a purge gas;
   depositing a protective layer on the seed layer by repeating a first cycle, the first cycle including supplying a base source material and subsequently supplying a silicon source material having a material composition identical to the first silicon source material;
   depositing a silicon nitride film on the protective layer by repeating a second cycle, the second cycle including supplying a second silicon source material and subsequently supplying a nitrogen source material; and
   forming an air gap by using a cleaning process, the cleaning process including removing portions of the silicon oxide film and of the seed layer.

2. The method according to claim 1, wherein the base source material comprises at least one of a carbon source material or a boron source material.

3. The method according to claim 1, wherein the depositing the protective layer further comprises supplying the nitrogen source material after supplying the base source material and before supply of the silicon source material having the material composition identical to the first silicon source material.

4. The method according to claim 1, wherein the seed layer has a thickness of 20 Å or less.

5. The method according to claim 1, wherein the protective layer has a thickness of 20 Å or less.

6. The method according to claim 1, wherein each of the first silicon source material and the second silicon source material include a halogen-substituted silane-based silicon precursor.

7. The method according to claim 1, wherein the purge gas includes hydrogen.

8. A method for manufacturing a semiconductor device, comprising:
forming a first impurity region on a substrate and a second impurity region on the substrate;
recessing the first impurity region to form a contact recess;
forming a bit line structure extending in the contact recess in one direction, the bit line structure contacting the first impurity region, and the bit line structure having a first side wall and a second side wall;
forming an inner spacer on the first side wall and the second side wall of the bit line structure;
forming a recess filler in a remaining region of the contact recess;
forming a sacrificial spacer on the inner spacer and on the recess filler;
forming an outer spacer on the sacrificial spacer;
forming a storage node contact contacting the second impurity region, the contacting the second impurity region performed at an outside of the outer spacer;
partially removing the sacrificial spacer and remaining portion of the outer spacer, to form an air gap between the outer spacer and the inner spacer;
forming a landing pad on the storage node contact;
forming a trench defining the landing pad, the forming the trench exposing an upper surface of the remaining portion of sacrificial spacer; and
forming a pad isolation insulating layer filling the trench,
wherein the forming the outer spacer is performed in a chamber without breaking vacuum and comprises
depositing a seed layer using a first silicon source material,
supplying a purge gas,
depositing a protective layer on the seed layer by repeating a first cycle comprising supplying a carbon source material and supplying the silicon source material having the material composition identical to the first silicon source material, and
depositing a preliminary main spacer on the protective layer by repeating a second cycle comprising supplying a second silicon source material and supplying a first nitrogen source material.

9. The method according to claim 8, wherein,
the forming the outer spacer comprises anisotropically etching the seed layer, the protective layer and the preliminary main spacer, to form a seed spacer, a protective spacer and a main spacer, and
the forming the air gap comprises partially removing the seed spacer.

10. The method according to claim 8, wherein the depositing the protective layer further comprises:
supplying a second nitrogen source material after supply of the carbon source material and before supply of the first silicon source material.

11. The method according to claim 8, wherein the seed layer is a silicon thin film not comprising carbon and not comprising nitrogen.

12. The method according to claim 11, wherein the forming the air gap comprises removing portions of the sacrificial spacer and the outer spacer through a cleaning process.

13. The method of claim 1, wherein the base source material comprises a carbon source material.

14. The method of claim 1, wherein the base source material comprises a boron source material.

15. The method of claim 10, wherein the protective layer has a thickness of 20 Å or less.

16. The method of claim 6, wherein the purge gas includes hydrogen.

17. The method of claim 1, wherein the chamber is a plasma-enhanced atomic layer deposition (PEALD) chamber.

18. The method of claim 8, wherein the chamber is a plasma-enhanced atomic layer deposition (PEALD) chamber.

* * * * *